(12) United States Patent
Ota

(10) Patent No.: US 12,356,813 B2
(45) Date of Patent: Jul. 8, 2025

(54) ELECTRO-OPTICAL DEVICE HAVING DIGITAL-TO-ANALOG CONVERSION CIRCUIT AND ELECTRONIC APPARATUS

(71) Applicant: SEIKO EPSON CORPORATION, Tokyo (JP)

(72) Inventor: Hitoshi Ota, Shiojiri (JP)

(73) Assignee: SEIKO EPSON CORPORATION, Tokyo (JP)

( * ) Notice: Subject to any disclaimer, the term of this patent is extended or adjusted under 35 U.S.C. 154(b) by 592 days.

(21) Appl. No.: 17/727,945

(22) Filed: Apr. 25, 2022

(65) Prior Publication Data

US 2022/0344444 A1    Oct. 27, 2022

(30) Foreign Application Priority Data

Apr. 26, 2021 (JP) .................................. 2021-074104

(51) Int. Cl.
*H01L 27/32* (2006.01)
*G09G 3/32* (2016.01)
(Continued)

(52) U.S. Cl.
CPC ............. *H10K 59/131* (2023.02); *G09G 3/32* (2013.01); *G09G 3/3291* (2013.01);
(Continued)

(58) Field of Classification Search
CPC ..... G09G 2310/027; G09G 2310/0248; G09G 2310/0297; G09G 3/3688; G09G 3/3291;
(Continued)

(56) References Cited

U.S. PATENT DOCUMENTS 6,420,988 B1   7/2002   Azami et al.
6,606,045 B2   8/2003   Azami et al.
(Continued)

FOREIGN PATENT DOCUMENTS

CN   1716377 A    1/2006
CN   104282261 A  1/2015
(Continued)

OTHER PUBLICATIONS

Mar. 16, 2023 Office Action issued in U.S. Appl. No. 17/981,066.
Jun. 16, 2023 Notice of Allowance issued in U.S. Appl. No. 17/981,066.

*Primary Examiner* — Dong Hui Liang
(74) *Attorney, Agent, or Firm* — Oliff PLC

(57) ABSTRACT

An electro-optical device includes a DA conversion circuit to convert 10 bits of data into an analog voltage output to a data line. The DA conversion circuit includes a first DA conversion circuit to convert upper 5 bits into a voltage and outputs converted voltage to the data line, a second DA conversion circuit to convert lower 5 bits into a voltage and outputs converted voltage to a relay line, and a coupling capacitance including one end electrically coupled to the second DA conversion circuit and another end electrically coupled to the data line, wherein the first DA conversion circuit includes a capacitance element corresponding to the upper 5 bits and is arranged in the Y direction along the data line, and the second DA conversion circuit includes a capacitance element corresponding to the lower 5 bits and is arranged in the Y direction along the data line.

8 Claims, 23 Drawing Sheets

(51) Int. Cl.
    *G09G 3/3291*     (2016.01)
    *H10K 59/121*     (2023.01)
    *H10K 59/131*     (2023.01)
    *G09G 3/3233*     (2016.01)

(52) U.S. Cl.
    CPC ..... *H10K 59/1213* (2023.02); *H10K 59/1216* (2023.02); *G09G 3/3233* (2013.01); *G09G 2300/0426* (2013.01); *G09G 2300/0819* (2013.01); *G09G 2300/0842* (2013.01); *G09G 2300/0861* (2013.01); *G09G 2310/0251* (2013.01); *G09G 2310/027* (2013.01)

(58) Field of Classification Search
    CPC ...... G09G 3/2011; G09G 3/3233; G09G 3/36; G09G 3/3648; G09G 3/20; G09G 3/32; G09G 3/30; G09G 3/3225; G09G 3/3614; G09G 2320/0276; G09G 2330/021; G09G 2300/0842; G09G 2300/0819
    See application file for complete search history.

(56) References Cited

U.S. PATENT DOCUMENTS

| | | | |
|---|---|---|---|
| 6,853,324 B2 * | 2/2005 | Maeda | H03M 1/804 341/172 |
| 6,970,121 B1 | 11/2005 | Sun | |
| 9,378,676 B2 | 6/2016 | Nomura | |
| 9,666,129 B2 | 5/2017 | Nomura | |
| 9,716,513 B1 * | 7/2017 | Chen | H03M 1/1295 |
| 9,799,267 B2 | 10/2017 | Nomura | |
| 9,939,400 B1 | 4/2018 | Gozzini et al. | |
| 2002/0163457 A1 | 11/2002 | Azami et al. | |
| 2003/0234736 A1 * | 12/2003 | Tachibana | H03M 1/68 341/172 |
| 2006/0139286 A1 | 6/2006 | Kida et al. | |
| 2007/0052568 A1 | 3/2007 | Horibata | |
| 2015/0009105 A1 | 1/2015 | Nomura | |
| 2016/0254822 A1 | 9/2016 | Sugawara | |
| 2016/0267840 A1 | 9/2016 | Nomura | |
| 2017/0169762 A1 | 6/2017 | Nomura | |

FOREIGN PATENT DOCUMENTS

| | | |
|---|---|---|
| JP | 2000-341125 A | 12/2000 |
| JP | 2007-053459 A | 3/2007 |
| JP | 2009-100152 A | 5/2009 |
| JP | 2015-011297 A | 1/2015 |
| WO | 2015/040756 A1 | 3/2015 |

\* cited by examiner

ELECTRO-OPTICAL DEVICE HAVING DIGITAL-TO-ANALOG CONVERSION CIRCUIT AND ELECTRONIC APPARATUS

The present application is based on, and claims priority from JP Application Serial Number 2021-074104, filed Apr. 26, 2021, the disclosure of which is hereby incorporated by reference herein in its entirety.

BACKGROUND

1. Technical Field

The present disclosure relates to an electro-optical device and an electronic apparatus.

2. Related Art

An electro-optical device using, for example, an OLED is known as a display element. OLED is an abbreviation for Organic Light Emitting Diode. In such an electro-optical device, a pixel circuit including a transistor for causing current to flow into the display element is provided corresponding to the pixel of the display image. The transistor supplies the current corresponding to a gradation level to the display element. As a result, the display element emits light at luminance corresponding to the current.

In the electro-optical device described above, a voltage corresponding to luminance is applied to a gate node of the transistor via a data line. More specifically, data specifying the luminance is converted into an analog voltage by a Digital-to-Analog (DA) conversion circuit, and the converted voltage is applied to the data line.

As such a DA conversion circuit, there has been proposed a technique of providing a set of switches and capacitance elements corresponding to each bit, and controlling charging and discharging of the capacitance elements in accordance with each bit by the switches (e.g., see JP-A-2000-341125).

As in recent years, when miniaturization and high resolution are required to the electro-optical device, there is a problem that some ingenuity is required when integrating the DA conversion circuit as described above into the electro-optical device.

SUMMARY

An electro-optical device according to an aspect of the present disclosure includes a display element provided corresponding to an intersection of a data line and a scanning line, and a DA conversion circuit, wherein the DA conversion circuit includes a first DA conversion circuit configured to convert upper two or more bits among a plurality of bits into a first gradation voltage corresponding to the upper two or more bits, and apply the first gradation voltage to the data line, a second DA conversion circuit configured to convert a part or all of the bits excluding the upper two or more bits among the plurality of bits into a second gradation voltage that reflects the part or all of the bits excluding the upper two or more bits, and a coupling capacitance including one end electrically coupled to the second DA conversion circuit and another end electrically coupled to the data line, the first DA conversion circuit includes an upper capacitance element portion including a first capacitance element and a second capacitance element corresponding to each of the upper two or more bits, the first capacitance element and the second capacitance element are arranged in a direction along the data line, the second DA conversion circuit includes a lower capacitance element portion including a third capacitance element and a fourth capacitance element corresponding to each of the part or all of the bits excluding the upper two or more bits, and the third capacitance element and the fourth capacitance element are arranged in a direction along the data line.

DESCRIPTION OF EXEMPLARY EMBODIMENTS

Hereinafter, an electro-optical device according to exemplary embodiments of the present disclosure will be described with reference to the drawings.

In each drawing, the dimensions and scale of each portion are appropriately different from the actual ones. Moreover, exemplary embodiments described below are suitable specific examples of the disclosure, and various technically preferable limitations are applied, but the scope of the disclosure is not limited to these modes unless it is specifically described in the following description to limit the disclosure.

First Exemplary Embodiment

Figure 1:
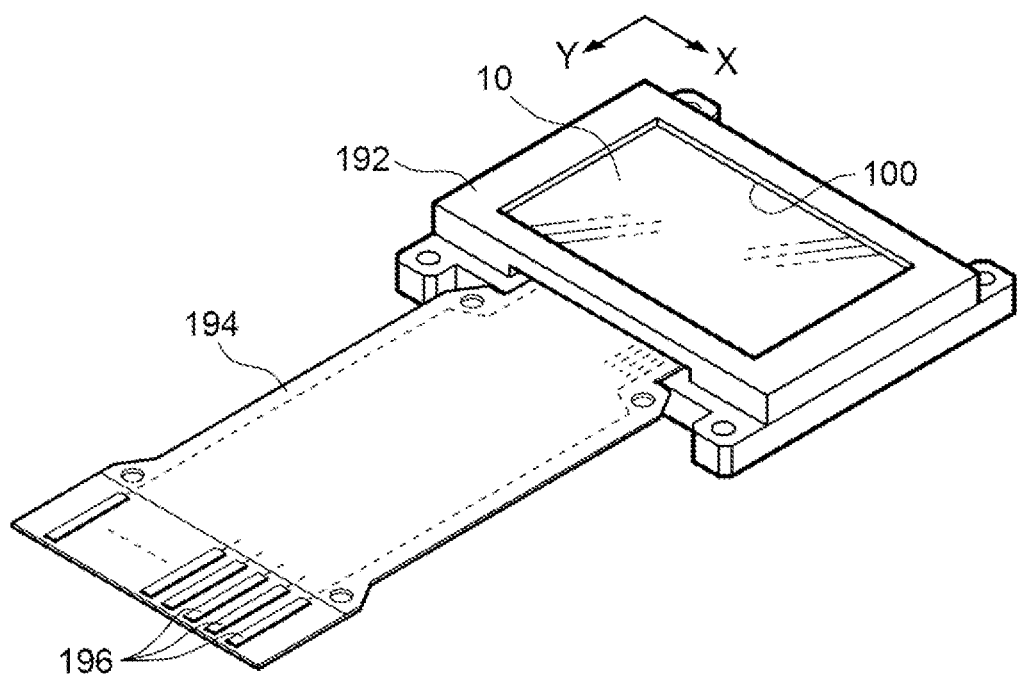
FIG. 1 is a perspective view illustrating an electro-optical device according to a first exemplary embodiment.

FIG. 1 is a perspective view illustrating an electro-optical device 10 according to a first exemplary embodiment. The electro-optical device 10 is a micro display panel that displays an image on, for example, a head-mounted display. The electro-optical device 10 includes a plurality of pixel circuits, a driving circuit for driving the pixel circuits, etc. The pixel circuit and the driving circuit are integrated into a semiconductor substrate. The semiconductor substrate is typically a silicon substrate, but may be other semiconductor substrates.

The electro-optical device 10 is accommodated in a frame-shaped case 192 that is exposed in a display region 100. The electro-optical device 10 is coupled to one end of a FPC substrate 194. Note that the FPC is an abbreviation for Flexible Printed Circuits. A plurality of terminals 196 for coupling a host device, which is not illustrated, is provided at the other end of the FPC substrate 194. When the plurality of terminals 196 are coupled to the host device, the electro-optical device 10 is supplied with video data, synchronization signals, etc. via the FPC substrate 194 from the host device.

Figure 2:
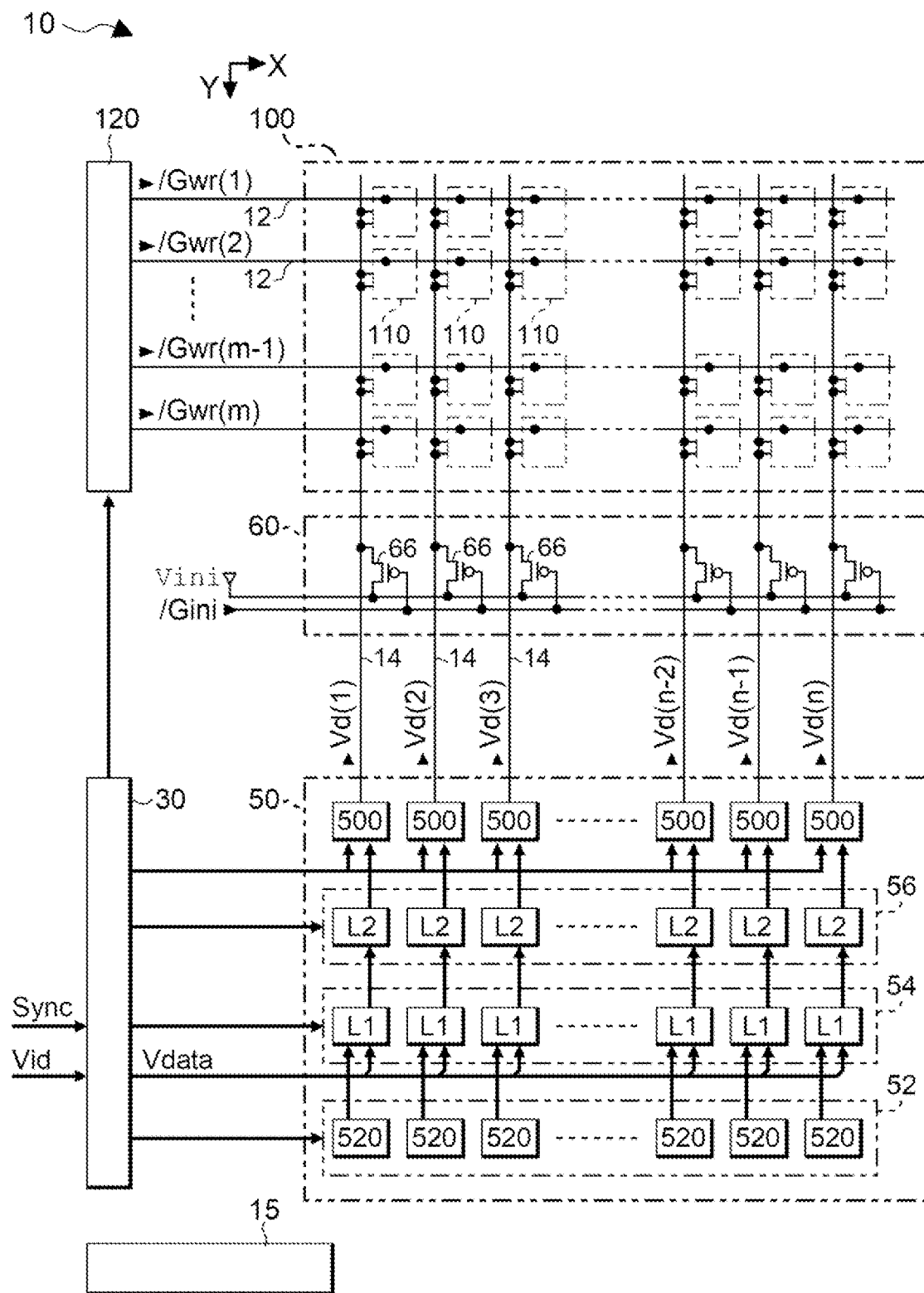
FIG. 2 is a block diagram illustrating an electrical configuration of the electro-optical device.

FIG. 2 is a block diagram illustrating an electrical configuration of the electro-optical device 10. As illustrated in the figure, the electro-optical device 10 is substantially classified into a power supply circuit 15, a control circuit 30, a data signal output circuit 50, a initialization circuit 60, a display region 100, and a scanning line driving circuit 120.

In the display region 100, m rows of scanning lines 12 are provided along the X direction in the figure, and n columns of data lines 14 are provided along the Y direction in the figure and so as to be electrically isolated from each scanning line 12. Note that m and n are integers of 2 or more.

In the display region 100, pixel circuits 110 are provided corresponding to an intersection of the m rows of scanning lines 12 and the n columns of data lines 14. Thus, the pixel circuits 110 are arranged in a matrix pattern with m rows vertically and n columns horizontally in the figure. In order to distinguish the row (rows) in the matrix array, they may be referred to as 1, 2, 3, . . . , (m−1), and m-th row sequentially in order from the top in the figure. Similarly, in order to distinguish the column (columns) of the matrix, they may be referred to as 1, 2, 3, . . . , (n−1), and n-th column sequentially in order from the left in the figure.

In order to generalize and illustrate the scanning line 12, an integer i of 1 to m is used. Similarly, in order to generalize and illustrate the data line 14, an integer j of 1 to n is used.

The control circuit 30 controls each portion based on video data Vid and a synchronization signal Sync supplied from the host device. The video data Vid specifies the gradation level of the pixel in an image to be displayed, for example, at 8 bits per three primary colors.

The synchronization signal Sync includes a vertical synchronization signal indicating a vertical scanning start of the video data Vid, a horizontal synchronization signal indicating a start of horizontal scanning, and a dot clock signal indicating a timing of one pixel portion of the video data.

The pixel of the image to be displayed in the present exemplary embodiment and the pixel circuit 110 in the display region 100 correspond to each other. On the other hand, the brightness characteristics indicated by the gradation level does not match the luminance characteristics of the pixel circuit 110 corresponding to the pixel, more specifically, the luminance characteristics of the OLED included in the pixel circuit 110.

In order to make the OLED emit light at the gradation level specified by the video data Vid with the luminance corresponding to the gradation level, the control circuit 30 up-converts 8 bits of the video data Vid to, for example, 10 bits in the present exemplary embodiment, and outputs the video data Vdata that specifies the luminance of the OLED.

For such up-conversion, a look-up table in which the correspondence between 8 bits of the input video data Vid and 10 bits of the output video data Vdata is stored in advance is used.

Further, the control circuit 30 generates various control signals to control each portion, but details will be described below.

The scanning line driving circuit 120 is a circuit for driving, for each row, the pixel circuits 110 arranged in m rows and n columns according to the control by the control circuit 30, and outputs various signals. For example, the scanning line drive circuit 120 sequentially supplies scanning signals /Gwr(1), /Gwr(2), . . . , /Gwr(m−1), /Gwr(m) to the scanning line 12 of the 1, 2, 3, . . . , (m−1), m-th row. Typically, the scanning signal supplied to the scanning line 12 of the i-th row is denoted as /Gwr(i).

Note that the scanning line driving circuit 120 outputs various control signals as well as the scanning signals /Gwr(1) to /Gwr(m), but details will be described below.

The data signal output circuit 50 is a circuit configured to output a data signal of a voltage corresponding to luminance toward the pixel circuit 110 located at a row selected by the scanning line driving circuit 120.

Specifically, the data signal output circuit 50 includes a selection circuit group 52, a first latch circuit group 54, a second latch circuit group 56, and n DA conversion circuits 500. The selection circuit group 52 includes a selection circuit 520 corresponding to each of the n columns, the first latch circuit group 54 includes a first latch circuit L1 corresponding to each of the n columns, and the second latch circuit group 56 includes a second latch circuit L2 corresponding to each of the n columns.

That is, a set of the selection circuit 520, the first latch circuit L1, the second latch circuit L2, and the DA conversion circuit 500 is provided corresponding to each column.

Here, the selection circuit 520 of the j-th column instructs the first latch circuit L1 of the j-th column to select the video data of the j-th column of the video data Vdata output from the control circuit 30, and the first latch circuit L1 of the j-th column latches the video data Vdata according to the instruction. The second latch circuit L2 of the j-th column outputs the video data Vdata latched by the first latch circuit L1 of the j-th column to the DA conversion circuit 500 of the j-th column in the writing period described later in accordance with the control by the control circuit 30.

The DA conversion circuit 500 of the j-th column converts the video data Vdata output from the second latch circuit L2 of the j-th column into a data signal of an analog voltage, and outputs the video data Vdata to the data line 14 of the j-th column as a data signal. The details of the DA conversion circuit 500 will be described later.

The initialization circuit 60 is an aggregate of transistors 66 having a one-to-one correspondence with the data line 14. One end of the transistor 66 corresponding to the j-th column is coupled to a feed line of a potential Vini, and the other end of the transistor 66 is coupled to the data line 14 of the j-th column. Further, a control signal /Gini by the control circuit 30 is commonly supplied to a gate node of the transistor 62 in each column.

The voltage of the data line 14 in the 1, 2, . . . , (n−1), n-th column is denoted as Vd(1), Vd(2), . . . , Vd(n−1), Vd(n). Typically, the voltage of the data line 14 of the j-th column is denoted as Vd(j).

The power supply circuit 15 generates various voltages, etc. used in the electro-optical device 10. Examples of the various voltages include power supply voltages in the scanning line driving circuit 120 and the data signal output circuit 50, potentials Vel, Vini, Vorst, Vrst, VL, VH, etc.

Figure 3:
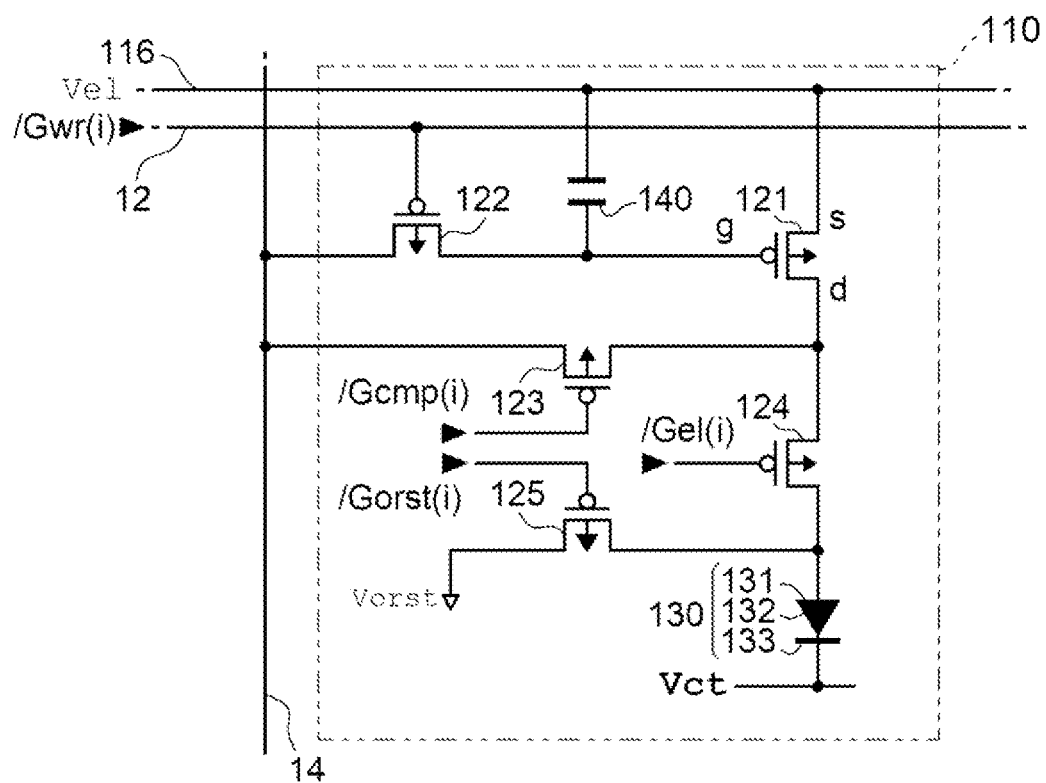
FIG. 3 is a circuit diagram illustrating a pixel circuit in the electro-optical device.

FIG. 3 is a circuit diagram illustrating the pixel circuit 110. The pixel circuits 110 arranged in m rows and n columns are electrically identical to each other. Therefore, the pixel circuits 110 will be described as represented by the pixel circuit 110 located at the i-th row and j-th column.

As illustrated, the pixel circuit 110 includes an OLED 130, p-type transistors 121 to 125, and a capacitance element 140. The transistors 121 to 125 are, for example, MOS type. Note that MOS is an abbreviation of Metal-Office-Semiconductor field-effect transistor.

Further, in addition to the scanning signal /Gwr(i), the control signals /Gel(i), /Gcmp(i), /Gorst(i) are supplied to the pixel circuit 110 of the i-th row from the scanning line drive circuit 120.

The control signal /Gel(i) is a generalized representation of the control signals /Gel(1), /Gel(2), . . . , /Gel(m−1), /Gel(m) that are supplied in order corresponding to 1, 2, . . . , (m−1), m-th row. Similarly, the control signal /Gcmp(i) is a generalized representation of the control signals /Gcmp(1), /Gcmp(2), . . . , /Gcmp(m−1), /Gcmp(m) that are supplied in order corresponding to 1, 2, . . . , (m−1), m-th row. The same is true for the control signal /Gorst(i), which is a generalized representation of the control signals /Gorst(1), /Gorst(2), . . . , /Gorst(m−1), /Gorst(m) that are supplied in order corresponding to 1, 2, . . . , (m−1), m-th row.

The OLED 130 is a light-emitting element in which a light-emitting function layer 132 is sandwiched between a pixel electrode 131 and a common electrode 133. The pixel electrode 131 functions as an anode, and the common electrode 133 functions as a cathode. Note that the common electrode 133 has light transparency.

In the OLED 130, when the current flows from the anode to the cathode, the holes injected from the anode and the electrons injected from the cathode recombine in the light-emitting function layer 132 to generate excitons, and white light is generated.

In the case of color display, the generated white light resonates in an optical resonator formed of, for example, a reflective layer and a semi-reflective semi-transparent layer (not illustrated), and is emitted at a resonance wavelength set corresponding to any one of the colors R (red), G (green), B (blue). A color filter corresponding to the color is provided on the emission side of the light from the optical resonator. Thus, the emitted light from the OLED 130 is visually recognized by the observer through coloration by the optical resonator and the color filter.

Note that the optical resonator is not illustrated. In a case where the electro-optical device 10 displays only a single color image only, the color filter is omitted.

In the transistor 121 of the pixel circuit 110 of the i-th row and j-th column, a gate node g is coupled to the drain node of the transistor 122, a source node s is coupled to a feed line 116, which is the power supply wiring line to which the potential Vel is supplied, and a drain node d is coupled to the source node of the transistor 123 and the source node of the transistor 124. In the capacitance element 140, one end is coupled to the gate node g of the transistor 121, and the other end is coupled to the feed line 116. Thus, the capacitance element 140 holds the voltage between the gate node g and the source node s in the transistor 121.

Note that the other end of the capacitance element 140 may be coupled to other feed lines whose voltage is kept substantially constant, even other than the feed line 116.

In the present exemplary embodiment, for example, a so-called MOS capacitance formed by sandwiching a gate insulating layer of the transistor with the semiconductor layer of the transistor and the gate electrode layer is used as the capacitance element 140. Here, as the capacitance element 140, the parasitic capacitance of the gate node g of the transistor 121 may be used, or a so-called metal capacitance formed by sandwiching an insulating layer between different conductive layers in the semiconductor substrate may be used.

In the transistor 122 of the pixel circuit 110 of the i-th row and j-th column, the gate node is coupled to the scanning line 12 of the i-th row, and the source node is coupled to the data line 14 of the j-th column. In the transistor 123 of the pixel circuit 110 of the i-th row and j-th column, the control signal /Gcmp(i) is supplied to the gate node, and the drain node is coupled to the data line 14 of the j-th column. In the transistor 124 of the pixel circuit 110 of the i-th row and j-th column, the control signal /Gel(i) is supplied to the gate node, and the drain node is coupled to the pixel electrode 131, which is the anode of the OLED 130, and the drain node of the transistor 125.

In the transistor 125 of the pixel circuit 110 of the i-th row and j-th column, the control signal /Gorst(i) is supplied to the gate node, and the source node is coupled to a feed line that is a power supply wiring line that is supplied with the potential Vorst.

Note that the potential Vorst is, for example, a potential Gnd, which is a reference of the voltage zero, or the potential at the low level close to the potential Gnd. Specifically, the potential Vorst is a potential to the extent such that current does not flow to the OLED 130 when applied to the pixel electrode 131 in the OLED 130.

Also, the potential Vct is applied to the common electrode 133 that functions as the cathode of the OLED 130.

Figure 4:
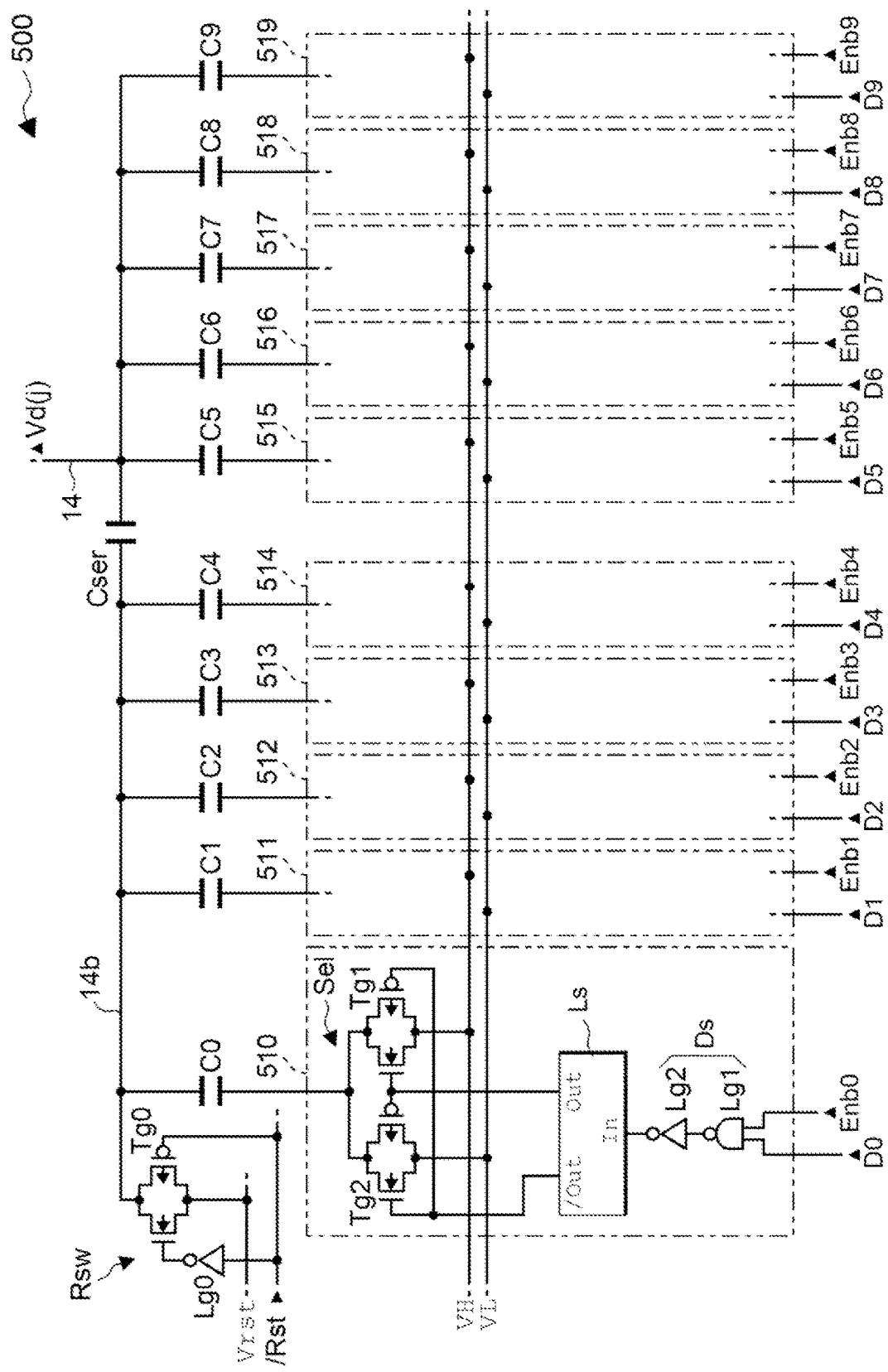
FIG. 4 is a circuit diagram illustrating a DA conversion circuit in a data signal output circuit.

FIG. 4 is a circuit diagram illustrating the DA conversion circuit 500 corresponding to the j-th column.

In the DA conversion circuit 500 of the j-th column, bits D0 to D9 are supplied from the second latch circuit L2 of the j-th column, and the control signals Enb0 to Enb9, the control signal /Rst are supplied from the control circuit 30, and the potentials Vrst, VH, VL are supplied from the power supply circuit 15.

Note that the potentials VH, VL are in the relationship of VH>VL.

The bits D0 to D9 are 10 bits of video data output from the second latch circuit L2 of the j-th column. The lowest bit of the 10 bits is denoted as D0, and the weights are increased as D1, D2, . . . in the order from the bit D0, and the highest bit is denoted as D9.

The control signals Enb0 to Enb9 are signals that specify the incorporation timing of bits D0 to D9 in the order. The control signal /Rst is a signal for resetting the capacitance element.

As illustrated, the DA conversion circuit 500 includes capacitance elements C0 to C9, Cser, switch Rsw and voltage selection circuits 510 to 519. The capacitance elements C0 to C9 and the voltage selection circuits 510 to 519 are paired so as to correspond to each bit. Specifically, the voltage selection circuit 510 and the capacitance element C0 are paired with each other, and corresponding to the bit D0; the voltage selection circuit 511 and the capacitance element C1 are paired with each other, and corresponding to the bit D1; and the voltage selection circuit 519 and the capacitance element C9 are paired with each other, and corresponding to the bit D9. The voltage selection circuits 510 to 519 select the potential VH or VL, and apply the selected voltage to one end of the corresponding capacitance element.

For example, the voltage selection circuit 510 corresponding to the bit D0 captures the bit D0 at a timing specified by the control signal Enb0, selects the potential VH or VL according to the logical level of the bit D0 captured, and applies the selected voltage to one end of the capacitance element C0. Further, for example, the voltage selection circuit 516 corresponding to the bit D6 captures the bit D6 at a timing specified by the control signal Enb6, selects the potential VH or VL according to the logical level of the bit D6 captured, and applies the selected voltage to one end of the capacitance element C6.

Note that in the present exemplary embodiment, among the 10 bits of the video data Vdata, the bits D5 to D9 are an example of upper bits, and the bits D0 to D4 are an example of all bits of the bits excluding the upper bits.

In the present exemplary embodiment, the capacitance elements C5 to C9 are examples of an upper capacitance element portion, and among them, for example, the capacitance element C5 is an example of a first capacitance element, and the capacitance element C6 is an example of a second capacitance element. In addition, in the present exemplary embodiment, the capacitance elements C0 to C5 are examples of a lower capacitance element portion, and among, for example, the capacitance element C0 is an example of a third capacitance element, and the capacitance element C1 is an example of a fourth capacitance element.

The capacitance size of the capacitance elements C0 to C9 have the following ratios in the present exemplary embodiment. Specifically, assuming that the capacitance size of the capacitance element C0 is "1", the capacitance sizes of the capacitance elements C2, C3, C4, C5, C6, C7, C8, C9 are "2", "4", "8", "16", "1", "2", "4", "8", "16" in this order.

The capacitance element Cser is an example of the coupling capacitance, and the capacitance size of the capacitance element Cser is, for example, "1". Note that a degree of error is acceptable as long as the linear properties of the capacitance sizes of the capacitance elements C0 to C9 and Cser are kept described below.

Note that, in the present exemplary embodiment, the MOS capacitance is used as the capacitance element 140, and thus the MOS capacitance is preferably used for the capacitance elements C0 to C9 and Cser, but the metal capacitance may be used.

In the present exemplary embodiment, if the capacitance size is the ratio as described above, the capacitance elements C0 to C9 and Cser are configured by coupling the capacitance elements having the capacitance size "1" in parallel in a number corresponding to the ratio. For example, if the capacitance elements C0 or C5 are configured by coupling two basic capacitance elements having the capacitance size ratio of "0.5" in parallel, the capacitance elements C4 and C9 are configured by coupling 32 basic capacitance elements in parallel.

In a configuration in which this configuration is coupled in parallel with the ratio of the capacitance size in this manner, the peripheral length of the electrode in plan view is also a length corresponding to the ratio of the capacitance size, and the effect of the capacitance generated by the peripheral edge of the electrode is also dependent on the ratio. Therefore, in a configuration in which the ratio of the capacitance size is coupled in parallel, it is possible to increase the accuracy of the ratio of the capacitance size compared to the configuration in which the electrode area is a ratio of the capacitance size rather than a parallel coupling.

Among the capacitance elements C0 to C9, the other end of the capacitance elements C0 to C4 corresponding to the lower 5 bits is electrically coupled to one end of the capacitance element Cser. For convenience, the coupling line between the other end of the capacitance element C0 to C4 and one end of the capacitance element Cser is denoted as a relay line 14b. Additionally, among the capacitance elements C0 to C9, the other end of the capacitance elements C5 to C9 corresponding to the upper 5 bits is electrically coupled to the other end of the data line 14 and the capacitance element Cser.

As used herein, "electrically coupled" means direct or indirect coupling or bonding between two or more elements, including a case where, for example, in a semiconductor substrate, the two or more elements are coupled via different wiring layers and contact holes even if they are not directly coupled to each other.

The switch Rsw is turned on or turned off in accordance with the control signal /Rst between the feed line and the relay line 14b to which the potential Vrst is applied. Specifically, the switch Rsw is turned on when the control signal /Rst is at the L level, and turned off when the control signal /Rst is at the H level.

In the present description, the on state of the switch or the transistor means that both ends of the switch or between the source node and the drain node in the transistor are electrically closed to be in a low impedance state. Further, the off state of the switch or the transistor means that both ends of the switch or between the source node and the drain node are electrically opened to be in a high impedance state.

Further, the switch Rsw is preferably configured by a NOT circuit Lg0 that outputs a negative signal of the control signal /Rst and a transmission gate Tg1. The transmission gate Tg1 is an analog switch that combines an n-type transistor in which a negative signal from the NOT circuit Lg0 is supplied to the gate node and a p-type transistor in which a control signal /Rst is supplied to the gate node.

The voltage selection circuit 510 paired with the capacitance element C0 includes an AND circuit Ds, a level shifter Ls, and a selector Sel.

Of these, the AND circuit Ds outputs a logical product signal of the bit D0 and the control signal Enb0 of the video data Vdata output from the second latch circuit L2 of the j-th column. The AND circuit Ds is actually configured by a NAND circuit Lg1 that outputs a negative logical product signal between the bit D0 and the control signal Enb0, and a NOT circuit L2 that outputs a negative signal of the negative logical signal.

The level shifter Ls converts a logical amplitude of the logical product signal output by the AND circuit Ds to output a positive signal that maintains a logical level of the logical product signal from the output end Out, and outputs an inversion signal that has inverted the logical level of the logical product signal from the output end /Out.

The selector Sel selects the potential VH when the positive signal output from the level shifter Ls is at the H level and the inversion signal is at the L level, and selects the potential VL when the positive signal is at the L level and the inversion signal is at the H level. The selector Sel then applies the selected voltage to one end of the capacitance element C0.

The selector Sel is actually configured by the transmission gate Tg1 provided between the feed line of the potential VH and the one end of the capacitance element C0, and a transmission gate Tg2 provided between the feed line of the potential VL and one end of the capacitance element C0.

In this configuration, when the positive signal output from the level shifter Ls is at the H level and the inversion signal is at the L level, the transmission gate Tg1 is turned on and the transmission gate Tg2 is turned off. When the positive signal output from the level shifter Ls is at the L level and the inversion signal is at the H level, the transmission gate Tg1 is turned off and the transmission gate Tg2 is turned on.

Here, the voltage selection circuit 510 paired with the capacitance element C0 has been described, but the other voltage selection circuits 511 to 519 have the same configuration as the voltage selection circuit 510 except that the bits D1 to D9 of the input signal and the control signals Enb1 to Enb9 are different.

Figure 5:
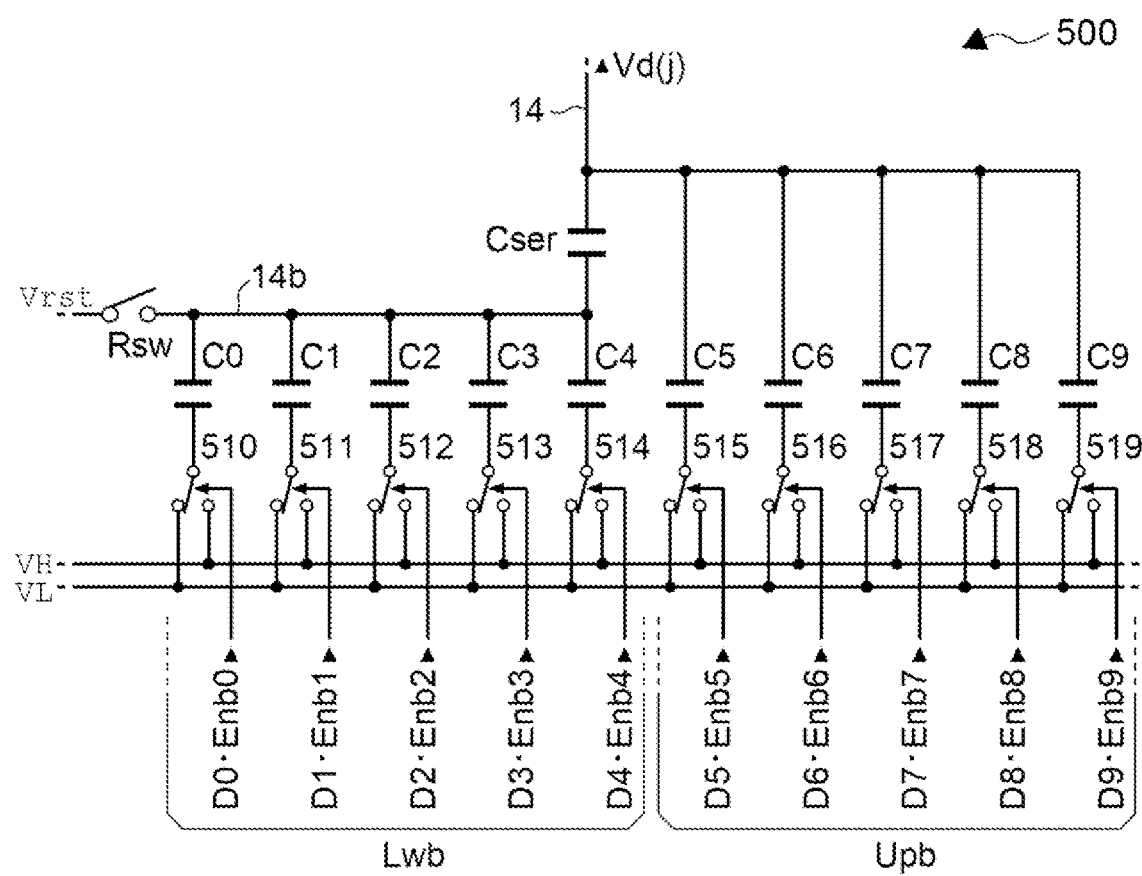
FIG. 5 is a diagram illustrating an equivalent circuit of the DA conversion circuit.

FIG. 5 is a diagram illustrating an equivalent circuit of the DA conversion circuit 500 of the j-th column. The voltage selection circuit 510 is denoted as a unipolar double throw switch that selects the potential VH or VL in accordance with the logic level of D0*Enb0, which is a logical product signal of the bit D0 and the control signal Enb0. The voltage selection circuits 511 to 519 are also denoted as unipolar double throw switches similar to the voltage selection circuit 510.

In FIGS. 4 and 5, the DA conversion circuit 500 of the j-th column has been described, but the DA conversion circuit 500 corresponding to the other columns has the same configuration.

Note that FIGS. 4 and 5 illustrate only an electrical configuration, and do not indicate positions and arrangements in the actual element.

The operation of DA conversion circuit 500 is divided into reset periods and output periods. Note that the reset period is the initialization period and the compensation period (b) described below, and the output period is the writing period (c) of the electro-optical device 10.

In the DA conversion circuit 500, charges corresponding to the capacitance size are accumulated in the capacitance elements C0 to C9 in the reset period, and the voltage atone end of the capacitance elements C0 to C9 changes (increases), or is maintained in accordance with bits D0 to D9 in the output period. Among the capacitance elements C0 to C9, at the other end of the capacitance elements C0 to C9 where the voltage at one end changes, the voltage of the accumulated charge is caused to increase depending on the capacitance size.

Among the capacitance elements C0 to C9, at the other end of the capacitance elements C5 to C9, the voltage of the data line 14 is increased in accordance with the capacitance size, while since the other end of the capacitance elements C0 to C4 are coupled to the data line 14 via the capacitance element Cser, the voltage change at the other end of the capacitance elements C0 to C4 is compressed in accordance with the capacitance ratio to change the voltage of the data line 14.

This causes the DA conversion circuit 500 to change the voltage of the data line 14 in a linear relationship with respect to bits D0 to D9. Details are described in detail in JP-A-2000-341125.

A voltage (first gradation voltage) corresponding to the weight of the upper bits D5 to D9 is output to the data line 14 by the capacitance elements C5 to C9 and the voltage selection circuits 515 to 519. Thus, the circuit including the capacitance elements C5 to C9 and the voltage selection circuits 515 to 519 will be referred to as a first DA conversion circuit Upb for convenience.

Similarly, a voltage corresponding to the weight of the lower bits D0 to D4 is output to the data line 14 by the capacitance elements C0 to C4, Cser and the voltage selection circuits 510 to 514. Of these, assuming a configuration that does not include the capacitance element Cser, a voltage reflecting the bits D0 to D4, that is, a voltage before compression (second gradation voltage) is output to the relay line 14b. The configuration including the capacitance elements C0 to C4 and the voltage selection circuits 510 to 514, and excluding the capacitance element Cser, will be referred to as a second DA conversion circuit Lwb for convenience.

Figure 6:
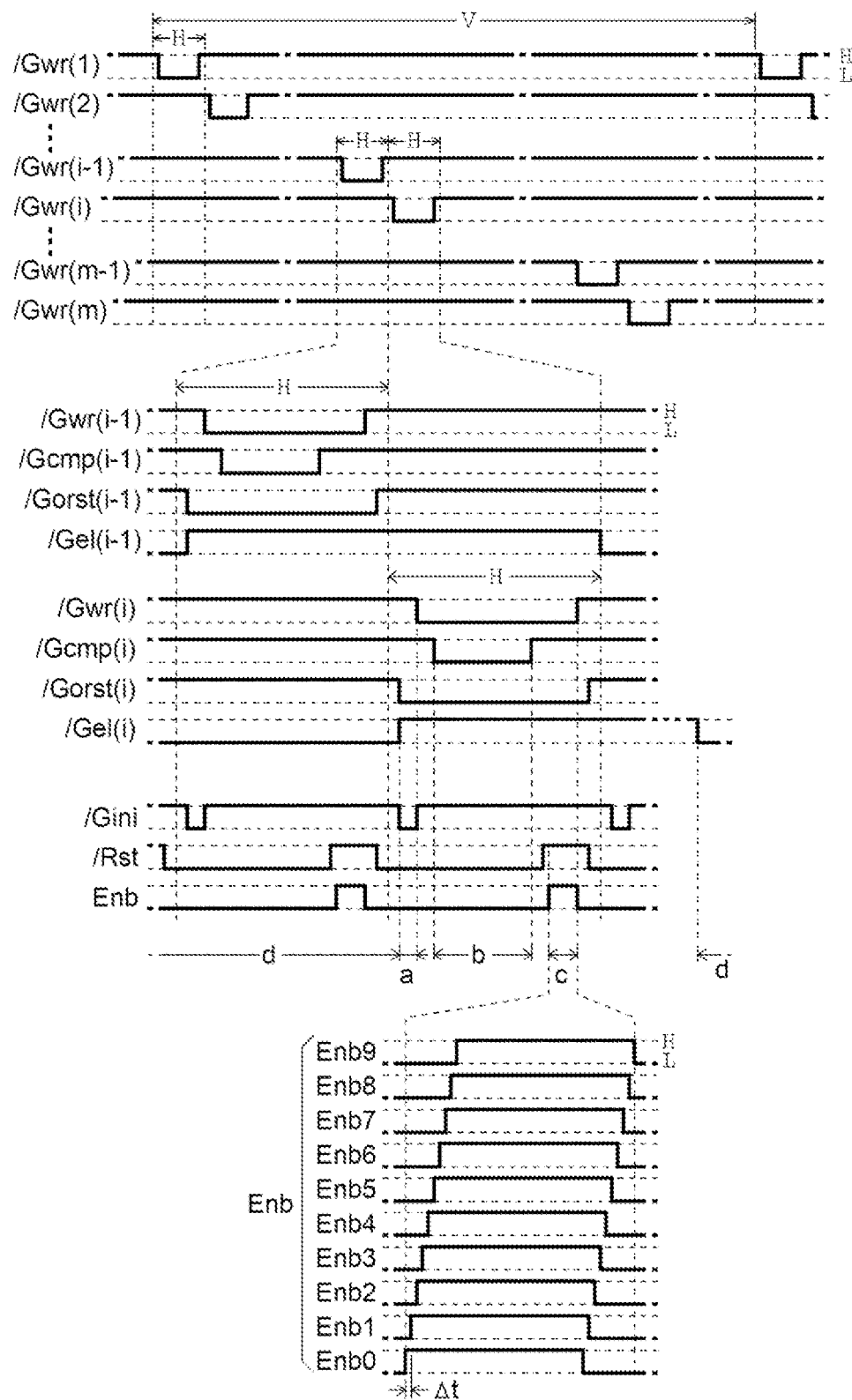
FIG. 6 is a timing chart illustrating operation of the electro-optical device.

FIG. 6 is a timing chart for illustrating operation the electro-optical device 10.

In the electro-optical device 10, the scanning line 12 having m rows is scanned by one row in the order of 1, 2, 3, . . . , m-th row in the frame (V) period. Specifically, as illustrated in the figure, the scanning signals /Gwr(1), /Gwr(2), . . . , /Gwr(m−1), /Gwr(m) are sequentially and exclusively at the L level for each horizontal scanning period (H) by the scanning line drive circuit 120.

Note that in the present exemplary embodiment, among the scanning signals /Gwr(1) to /Gwr(m), the period during which the adjacent scanning signals reach the L level is temporally separated. Specifically, after the scanning signal /Gwr(i−1) changes from the L level to the H level, the next scanning signal /Gwr(i) becomes the L level after a period of time. This period corresponds to the horizontal blanking interval.

In the present description, one frame (V) period refers to a period required to display a single frame of an image specified by the video data Vid. In a case where the length of the one frame (V) is the same as the vertical synchronization period, for example, if the frequency of the vertical synchronization signal included in the synchronization signal Sync is 60 Hz, it is 16.7 milliseconds, which corresponds to one cycle of the vertical synchronization signal. Further, the horizontal scanning period (H) is an interval of time during which the scanning signals /Gwr (1) to /Gwr (m) sequentially reach the L level, however, in the figure, for convenience, the start timing of the horizontal scanning period (H) is almost centered on the horizontal blanking interval.

In the present exemplary embodiment, one horizontal scanning period (H) is mainly divided into three periods of the initialization period (a), the compensation period (b), and the writing period (c). Further, as the operation of the pixel circuit 110, the light emission period (d) is further added separately from the three periods described above.

In each horizontal scanning period (H), in the initialization period (a), the control signal /Gini is at the L level, the control signal /Rst is at the L level, and the control signal Enb is at the L level. Note that the control signal Enb is a signal collectively referred to as the control signals Enb0 to Enb9. The phases of the control signals Enb0 to Enb9 are sequentially shifted in the writing period (c) as described later, but since they have the same waveform except for the writing period (c), they are collectively referred to as the control signals Enb.

In the compensation period (b), the control signal /Gini is at the H level, and the control signals /Rst and Enb maintain the L level.

In the writing period (c), the control signal /Gini maintains the H level, and the control signals /Rst and Enb are at the H level.

The operation in the horizontal scanning period (H) will be described by taking the i-th row as an example. Further, the pixel circuit 110 will be described by taking the pixel circuit 110 of the i-th row and j-th column as an example.

In the horizontal scanning period (H) of the i-th row, the initialization period (a) of the i-th row starts before the scanning signal /Gwr(i) reaches the L level. The initialization period (a) is a period for resetting the voltage or electric charge remaining in each portion in the horizontal scanning period (H) of the (i–1) th row.

Figure 7:
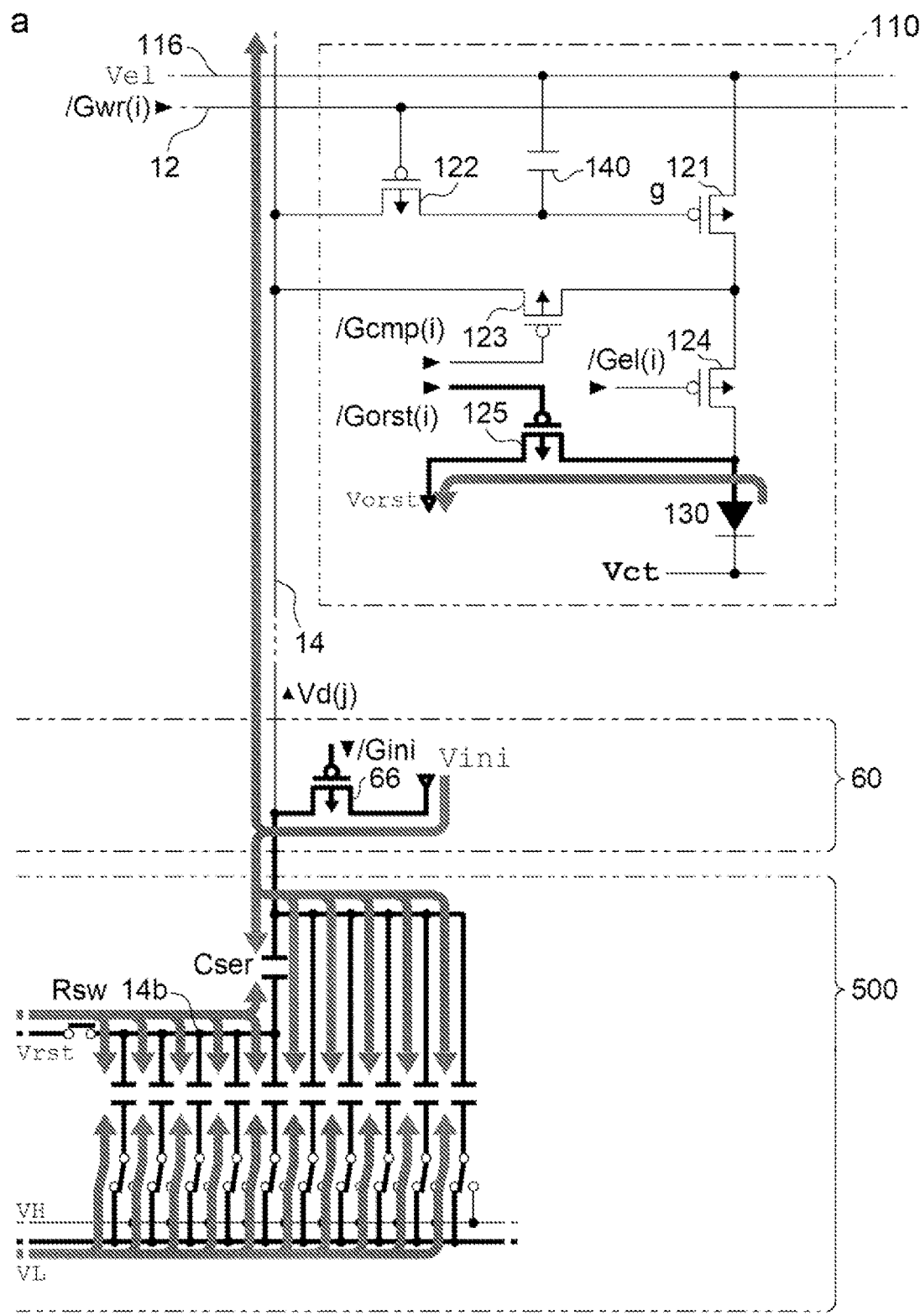
FIG. 7 is a diagram illustrating operation of the electro-optical device.

FIG. 7 is a diagram for illustrating operation of the pixel circuit 110 of the i-th row and j-th column and the DA conversion circuit 500 corresponding to the data line 14 of the j-th column in the initialization period (a) of the i-th row.

In the initialization period (a), the transistor 66 is turned on by setting the control signal /Gini to the L level, and thus the data line 14 is initialized to the potential Vini. In addition, in the initialization period (a), the switch Rsw is turned on by setting the control signal /Rst to the L level, and thus the potential Vrst is applied to the relay line 14b. In the initialization period (a), since the control signal Enb is at the L level, in particular, the control signals Enb0 to Enb9 are all at the L levels, so that, regardless of the logic level of the bits D0 to D9 output from the second latch circuit L2, the logical product signal of each of the AND circuits Ds in the voltage selection circuits 510 to 519 is at the L level. Thus, each of the voltage selection circuits 510 to 519 selects the potential VL.

Thus, in the initialization period (a), the potential VL is applied to one end of the capacitance elements C0 to C9, the potential Vrst is applied to one end of the capacitance element Cser and the other end of the capacitance elements C0 to C4, and the potential Vini is applied to the other end of the capacitance element Cser and the other end of the capacitance elements C5 to C9 via the data line 14. In this manner, in the initialization period (a), the charge stored in the capacitance elements C0 to C9 and Cser is initialized with the initialization of the data line 14.

Additionally, in the initialization period (a) of the i-th row, the control signal /Gel(i) is at the H level, and the control signal /Gorst(i) is at the L level. Thus, in the pixel circuit 110 of the i-th row, the transistor 124 is turned off and the transistor 125 is turned on, so the potential Vorst is applied to the pixel electrode 131, which is an anode of the OLED 130. Thus, the OLED 130 is turned off and the pixel electrode 131 is reset to the potential Vorst.

Note that, the reason for resetting the pixel electrode 131 is to eliminate the influence of the voltage applied during the immediately preceding light emission period because the OLED 130 has a capacitance.

After the initialization period (a), the compensation period (b) begins. The compensation period (b) is a period for causing the gate node g of each transistor 121 to converge at a voltage corresponding to a threshold value of the transistor 121 in the n pixel circuits 110 located at the i-th row.

Figure 8:
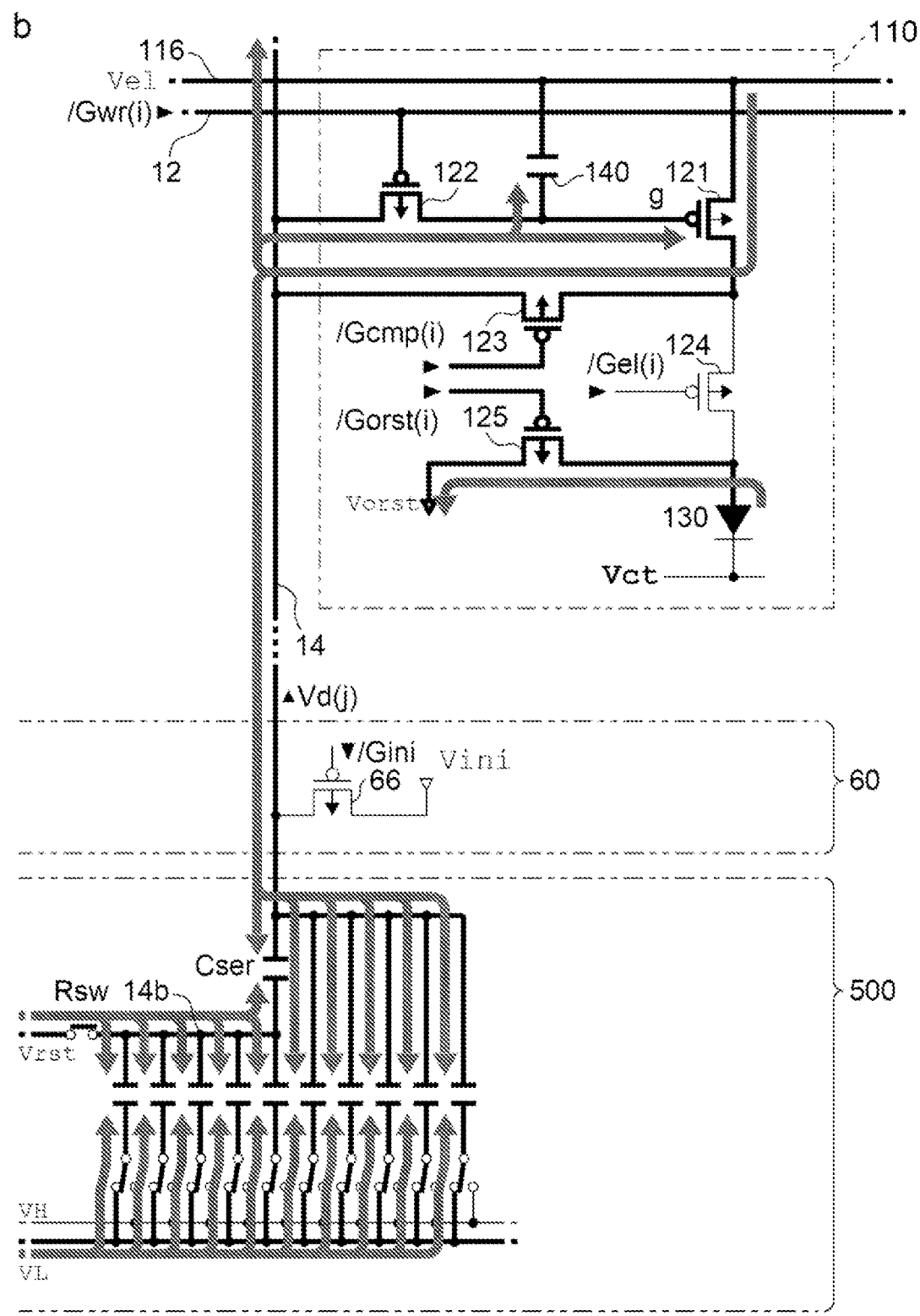
FIG. 8 is a diagram illustrating operation of the electro-optical device.

FIG. 8 is a diagram for illustrating operation of the pixel circuit 110 of the i-th row and j-th column and the DA conversion circuit 500 corresponding to the data line 14 of the j-th column in the compensation period (b) of the i-th row.

In the compensation period (b), the control signal /Gini is at the H level so that the transistor 66 is turned off. Additionally, in the compensation period (b), since the control signal /Rst is at the L level, the on state of the switch Rsw is maintained, and since the control signal Enb is at the L level, the selection of the potential VL by the voltage selection circuits 510 to 519 is maintained.

Additionally, in the compensation period (b) of the i-th row, the scanning signal /Gwr(i) reaches the L level, and the control signal /Gcmp(i) is at the L level in the state of the L level. Thus, in the pixel circuit 110 of the i-th row, the transistor 122 is turned on and the transistor 123 is turned on. Thus, the transistor 121 is in a diode-coupled state, so that the gate node and the source node in the transistor 121 converge to a threshold voltage of the transistor 121.

In the compensation period (b) of the i-th row, since the transistors 122 and 123 in the pixel circuit 110 are in the on state, the other end of the capacitance element Cser and the other end of the capacitance elements C5 to C9 converge to a voltage corresponding to a threshold voltage of the transistor 121 via the data line 14.

Note that in the compensation period (b), the application of the potential VL is maintained at one end of the capacitance elements C0 to C9 by the voltage selection circuits 510 to 519, and the application of the potential Vrst is maintained at one end of the capacitance element Cser and the other end of the capacitance elements C0 to C4 by the on state of the switch Rsw.

In the compensation period (b) of the i-th row, in the pixel circuit 110 of the i-th row, the off state of the transistor 124 and the on state of the transistor 125 continue from the initialization period (a).

After the completion of the compensation period (b), the writing period (c) begins. The writing period (c) is a period for applying a voltage corresponding to luminance to the gate node g of each transistor 121 in the pixel circuit 110 of the n columns located at the i-th row.

Figure 9:
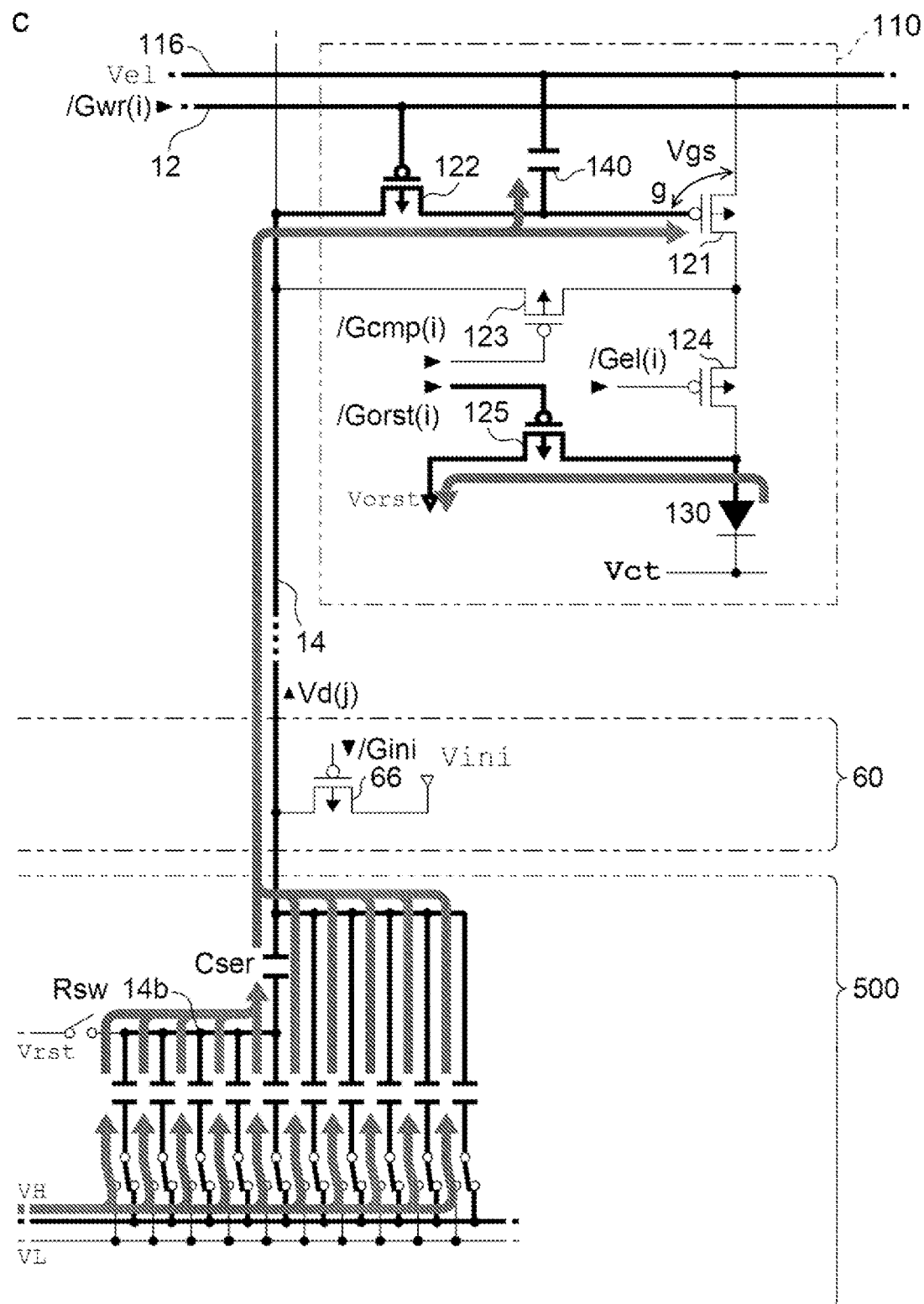
FIG. 9 is a diagram illustrating operation of the electro-optical device.

FIG. 9 is a diagram for illustrating operation of the pixel circuit 110 of the i-th row and j-th column and the DA conversion circuit 500 corresponding to the data line 14 of the j-th column in the writing period (c) of the i-th row.

In the writing period (c), the control signal /Rst is at the H level, and thus the switch Rsw is turned off. In the writing period (c), after the control signal Enb0 becomes the H level, as illustrated in FIG. 6, the control signals Enb1 to Enb9 are sequentially delayed with time ΔT and reach the H level. In addition, when the control signal Enb0 changes from the H level to the L level, the control signals Enb1 to Enb9 are sequentially delayed with the time ΔT and reach the L level.

Of the video data output from the second latch circuit L2 of the j-th column, the period during which the bit D0 is input to the level shifter Ls of the voltage selection circuit 510 is limited to a period during which the control signal Enb0 is at the H level by the AND circuit Ds. Similarly, the period during which bits D1 to D9 are input to the level shifter Ls in the voltage selection circuits 511 to 519 is limited to a period during which the control signals Enb1 to Enb9 are at the H level in order by the AND circuit Ds. Therefore, the bits D0 to D9 are sequentially delayed with the time ΔT, not simultaneously, by the voltage selection circuits 510 to 519.

Among the voltage selection circuits 510 to 519, the voltage selection circuit in which the bit input to the level shifter Ls is "1" selects the potential VH, and the voltage selection circuit in which the bit is "0" selects the potential VL.

In the writing period (c), one end of the capacitance element corresponding to the "0" bit input to the level shifter Ls among the capacitance elements C0 to C9 does not change voltage from the compensation period (b), and thus does not contribute to the voltage rise of the data line 14.

Among the capacitance elements C5 to C9 corresponding to the upper 5 bits, one end of the capacitance element corresponding to the "1" bit input to the level shifter Ls changes from the potential VL to the potential VH in the writing period (c). Thus, among the capacitance elements C5 to C9, the capacitance element corresponding to the "1" bit raises the data line 14 from the voltage corresponding to the threshold voltage in the compensation period (b) by the amount corresponding to the weight of the capacitance size.

Among the capacitance elements C0 to C4 corresponding to the lower 5 bits, one end of the capacitance element corresponding to the "1" bit input to the level shifter Ls changes from the potential VL to the potential VH in the writing period (c). However, different from the other end of the capacitance elements C5 to C9, the other end of the capacitance elements C0 to C4 is coupled to the data line 14 via the capacitance element Cser. Thus, among the capacitance elements C0 to C4, the change in the value from the potential VL to the potential VH at one end of the capacitance element corresponding to the "1" bit is compressed by the capacitance ratio, and the voltage of the data line 14 is increased.

In this manner, in the writing period (c), the DA conversion circuit 500 of the j-th column causes the data line 14 of the j-th column to increase from a voltage corresponding to the threshold voltage to a voltage corresponding to the bits D0 to D9 of the video data Vdata of the i-th row and j-th column, or a voltage that specifies the luminance of the OLED of the i-th row and j-th column.

In the present exemplary embodiment, in the writing period (c), the period during which the control signals Enb0 to Enb9 reach the H level is sequentially delayed with the time ΔT. The reason is that when the control signals Enb0 to Enb9 are set to the H level in unison, the change from the potential VL to the VH occurs at the same time, and the spike variation associated with the voltage switching increases, and, in particular, propagates to each portion, especially to the data line 14, which lowers the DA conversion accuracy. Therefore, in the present exemplary embodiment, the phase of the control signals Enb0 to Enb9 is shifted sequentially so that the switching from the potential VL to the VH does not occur simultaneously.

According to the present exemplary embodiment, the effect of the voltage variation due to the spike in voltage switching is reduced, and thus a decrease in the DA conversion accuracy is suppressed.

Note that the order in which the control signals Enb0 to Enb9 reach the H level does not need to be the order of the control signals Enb0 to Enb9.

In the writing period (c), in the pixel circuit 110 of the i-th row and j-th column, the transistor 122 is turned on, and the transistor 123 is turned off, so that the voltage Vd(j) output from the DA conversion circuit 500 of the j-th column is applied via the data line 14 in the gate node g of the transistor 121.

In the figure, the voltage of the difference between the voltage of the gate node g and the potential Vel of the source node in the transistor 121 is denoted as Vgs and is held by the capacitance element 140.

Note that in the writing period (c) of the i-th row, in the pixel circuit 110 of the i-th row, the off state of the transistor 124 and the on state of the transistor 125 continue.

FIG. 9 illustrates a case where all of the bits D0 to D9 of video data output from the second latch circuit L2 are "1".

After the writing period (c), the light emission period (d) begins. The light emission period (d) is a period for causing the current corresponding to the voltage Vgs held in the writing period (c) to flow through the OLED 130 to emit light.

Figure 10:
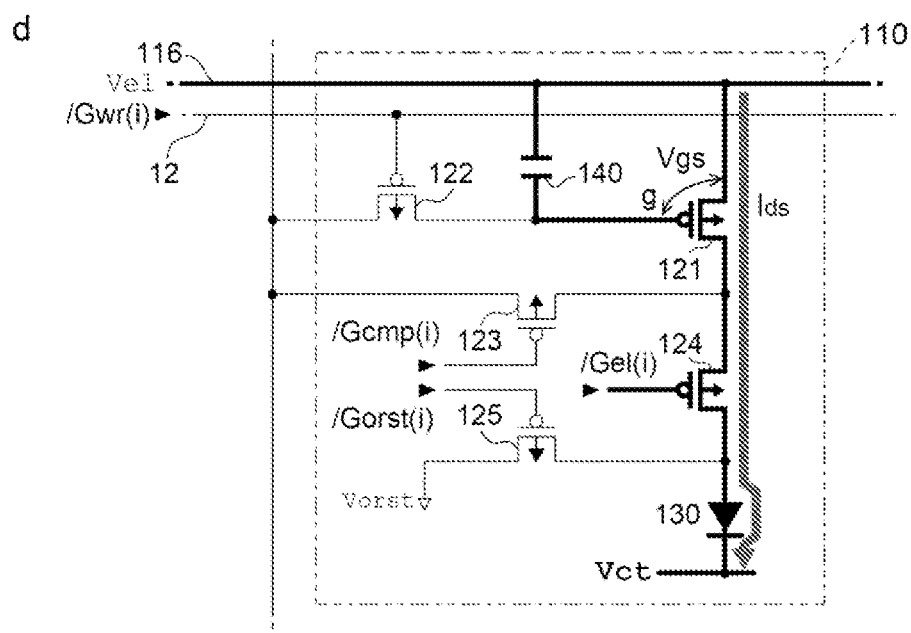
FIG. 10 is a diagram illustrating operation of the electro-optical device.

FIG. 10 is a diagram for illustrating the operation of the pixel circuit 110 of the i-th row and j-th column in the light emission period (d) of the i-th row.

The control signal /Gcmp(i) is at the H level before the light emission period (d) of the i-th row, so the transistor 123 is turned off. In addition, when the light emission period (d) of the i-th row is reached, the control signal /Gel(i) is inverted to the L level, and thus the transistor 124 is turned on. Thus, the current Ids in accordance with the voltage Vgs held by the capacitance element 140 flows through the transistor 121 in the OLED 130. Thus, the OLED 130 emits light at luminance in accordance with the current Ids.

Note that FIG. 10 is an example in which the light emission period (d) is continuous after the end of selection of the scanning line 12 of the i-th row, but the period during which the control signal /Gel(i) is at the L level may be intermittent, or may be adjusted in accordance with the luminance adjustment. Furthermore, the level of the control signal /Gel(i) in the light emission period (d) may be raised above the L level in the compensation period (b). That is, an intermediate level between the H level and the L level may be used for the level of the control signal /Gel(i) in the light emission period (d).

In addition, in the light emission period (d) of the i-th row, the DA conversion circuit 500 corresponding to the j-th column may have the operation of the horizontal scanning period (H) for other rows other than the i-th row, and thus the DA conversion circuit 500 is omitted in FIG. 10.

In FIGS. 7 to 9, in the horizontal scanning period (H) of the i-th row, the DA conversion circuit 500 corresponding to the j-th column and the pixel circuit 110 of the i-th row and j-th column are focused, but similar operation is performed for the DA conversion circuit 500 and the pixel circuit 110 corresponding to another column other than the j-th column.

Also, in FIGS. 7 to 9, the horizontal scanning period (H) of the i-th row has been focused, and the operation of the horizontal scanning period (H) has been described, but the similar operation is performed sequentially for the horizontal scanning period (H) of 1, 2, 3, . . . , m-th row.

In the pixel circuit 110, the voltage Vgs in the writing period (c) and the light emission period (d) is a voltage that is changed in accordance with the gradation level of the pixel circuit 110 from a voltage corresponding to a threshold voltage in the compensation period (b). Since similar operation is performed on another pixel circuit 110, in this exemplary embodiment, the current corresponding to the gradation level flows in the OLED 130 while the threshold value of the transistor 121 is compensated for all of the pixel circuits 110 of the m-row and n-th column. Thus, in the present exemplary embodiment, the variation in luminance is reduced, and the high-quality display is possible.

Figure 11:
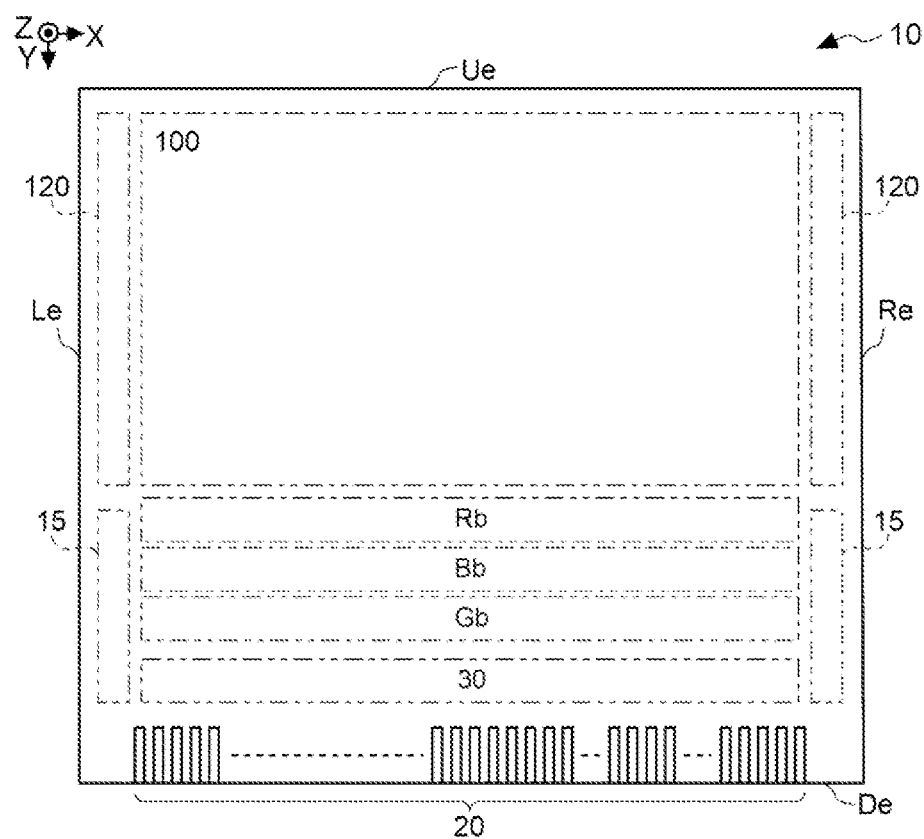
FIG. 11 is a plan view illustrating a position of each element in an electro-optical device.

FIG. 11 is a plan view illustrating an arrangement of each element in the electro-optical device 10 according to the first embodiment. Since the electro-optical device 10 is diced from a wafer-shaped semiconductor substrate, it has a rectangular shape. Therefore, in the electro-optical device 1 having a rectangular shape, the reference sign on the upper side is denoted as Ue, the reference sign on the lower side is denoted as De, the reference sign on the left side is denoted as Le, and the reference sign on the right side is denoted as Re.

Note that in the electro-optical device 1 having a rectangular shape, the upper side Ue and the lower side De are along the X direction that is the extension direction of the scanning line 12, and the left side Le and the right side Re are along the Y direction that is the extension direction of the data line 14.

In the figure, the Z direction is perpendicular to the X direction and the Y direction, and is an emission direction of light emitted from the OLED 130. The plan view in the present description indicates a case where the electro-optical device 1 is viewed in the direction opposite to the Z direction.

The scanning line driving circuit 120 is provided in a region between the display region 100 and the left side Le, and the scanning line driving circuit 120 is provided in a region between the display region 100 and the right side Re. The two scanning line driving circuits 120 have the same configuration, and drive the scanning lines 12, etc. on the left and right.

In the configuration in which the scanning line driving circuit 120 is disposed only on the left or right side, the signal delay occurs on the other hand on the left or right side. In contrast, in a configuration in which the scanning line driving circuits 120 are disposed on both the left and right, the delay of the signal can be prevented.

In the electro-optical device 10, a plurality of terminals 20 are provided along the lower side De. In a region between the display region 100 and the plurality of terminals 20, circuits Rb, Bb, Gb and the control circuit 30 are provided in order from the display region 100.

The circuit Rb is a circuit that aggregates the data signal output circuits 50 corresponding to the data line 14 of R among the data signal output circuits 50 including the selection circuit group 52, the first latch circuit group 54, the second latch circuit group 56, and the DA conversion circuit 500. The circuit Bb is a circuit that aggregates the data signal output circuits 50 corresponding to the data line 14 of B. The circuit Gb is a circuit that aggregates the data signal output circuits 50 corresponding to the data line 14 of G.

The power supply circuit 15 is provided in a region between the circuits Rb, Bb, Gb and the left side Le, and the power supply circuit 15 is also provided in a region between the circuits Rb, Bb, Gb and the right side Re. The two power supply circuits 15 have the same configuration, and supply various voltages to the scanning line driving circuit 120, the circuits Rb, Bb, Gb, and the control circuit 30.

Figure 12:
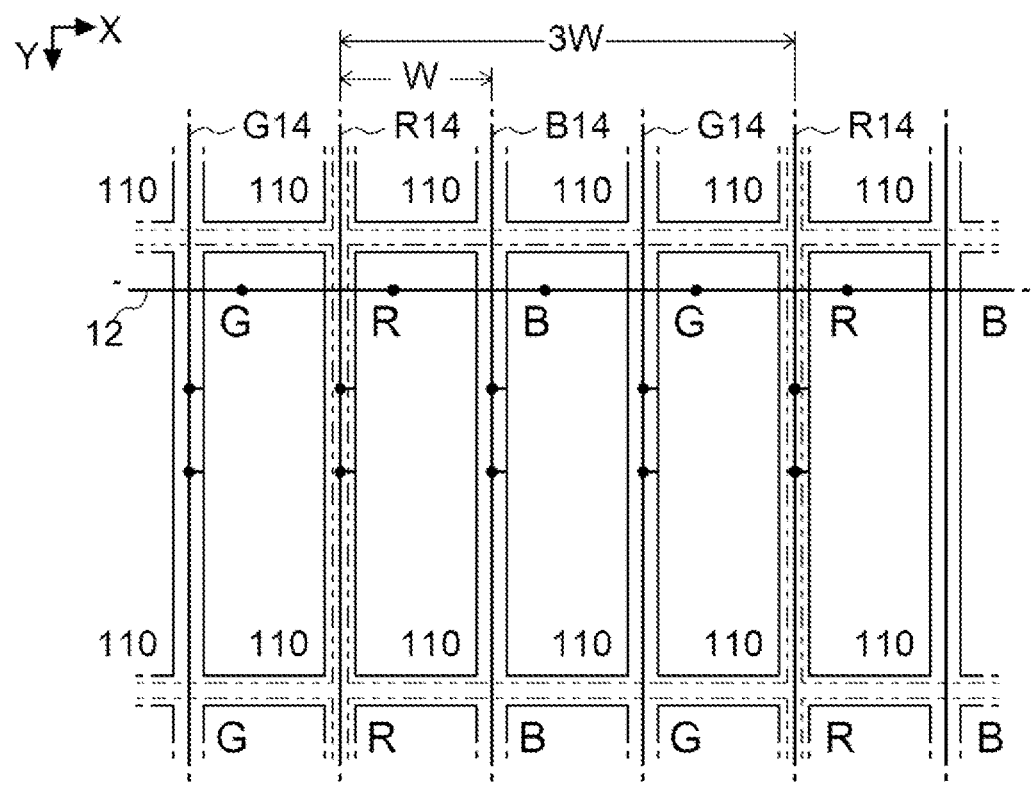
FIG. 12 is a plan view illustrating an arrangement in the pixel circuit.

FIG. 12 is a plan view illustrating the arrangement of the pixel circuit 110 in the display region 100. As illustrated in this figure, the pixel circuit 110 of R, the pixel circuit 110 of B, and the pixel circuit 110 of G are arranged along the X direction, and the pixel circuits 110 of the same color are arranged along the Y direction. Thus, focusing on any one column of the data lines 14, it corresponds to the pixel circuit 110 having the same color.

Note that one color is represented the additive color mixing of the pixel circuits 110 of the RBGs adjacent to each other in the X direction. Therefore, the pixel circuit 110 should be referred to as a subpixel circuit in a strict manner, but in this exemplary embodiment, the display of the light-dark only monochrome image is also possible, and thus, the pixel circuit 110 is denoted as a pixel circuit without being distinguished.

In the figure, the width W is an arrangement interval of the data lines 14 when viewed in the X direction, and is an example of a first width. The width 3W is the interval between three times the width W, i.e., an interval when one unit is three data lines 14 required for displaying one color.

Additionally, in order to distinguish the data line 14 from each other in the figure, the reference sign of the data line corresponding to the pixel circuit 110 of R is denoted as R14, and the reference sign of the data line corresponding to the pixel circuit 110 of B is denoted as B14, and the reference sign of the data line corresponding to the pixel circuit 110 of G is denoted as G14. If the color is not distinguished, the reference sign of the data line is denoted as 14 as described above.

Figure 13:
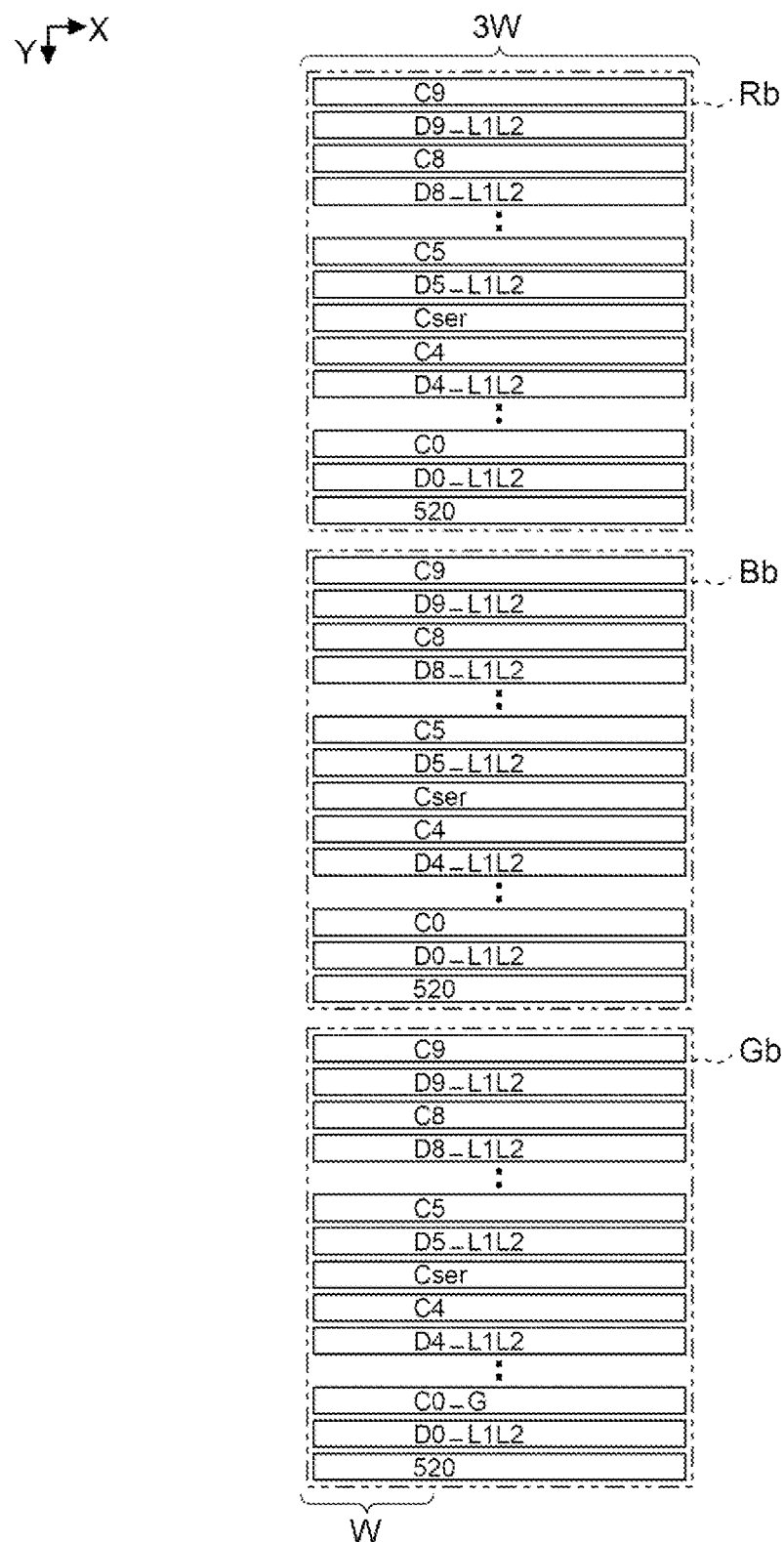
FIG. 13 is a diagram illustrating an arrangement of three columns of elements in the data signal output circuit.
Figure 14:
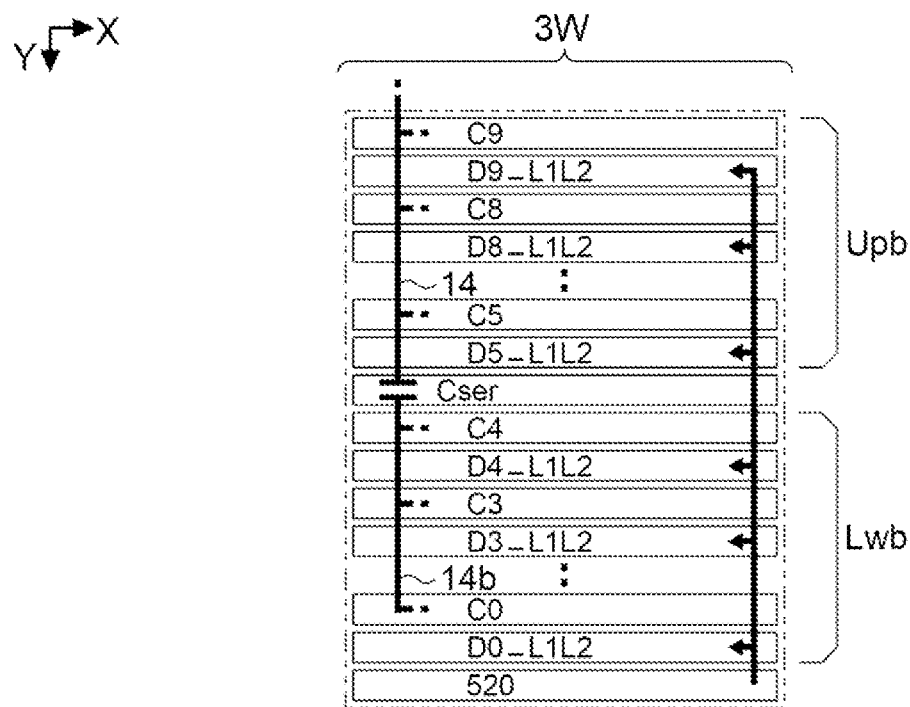
FIG. 14 is a diagram illustrating an arrangement of elements for one color in the data signal output circuit.

FIG. 13 is a diagram illustrating the arrangement of each element in the circuits Rb, Bb, Gb corresponding to the j-th column, focusing on the data line 14 of the j-th column of the data signal output circuit 50. FIG. 14 is a diagram illustrated by extracting any one of the circuits Rb, Bb, Gb.

As illustrated in FIG. 13, the circuits Rb, Bb, Gb are arranged in a single column along the Y direction in a range that is wider than width W and narrower than width 3W. Of these circuits, in the circuit Rb, the elements are arranged in the following order when viewed from the Y direction, that is, from the upward direction in the figure. In particular, in the circuit Rb, the capacitance element C9, the circuit D9_L1L2, the capacitance element C8, the circuit D8_L1L2, the capacitance element C7, the circuit D7_L1L2, the capacitance element C6, the circuit D6_L1L2, the capacitance element C5, the circuit D5_L1L2, the capacitance element Cser, the capacitance element C4, the circuit D4_L1L2, the capacitance element C3, the circuit D3_L1L2, the capacitance element C2, the circuit D2_L1L2, the capacitance element C1, the circuit D1_L1L2, the capacitance element C0, the circuit D0_L1L2, and the selection circuit 520 are arranged in this order.

Note that the circuit Dk_L1L2 is a circuit provided corresponding to the bit Dk among the first latch circuit L1 and the second latch circuit L2 provided corresponding to the j-th column. k is an integer to generally describe the bits, and is either 0 to 9 in this exemplary embodiment. For example, the circuit D6_L1L2 is a circuit provided corresponding to the bit D6 among the first latch circuit L1 and the second latch circuit L2 provided corresponding to the j-th column.

For circuits Gb, Rb, elements are arranged in the same order as the circuit Rb.

In the circuits Rb, Bb, Gb, accordingly, the capacitance elements C0 to C4 corresponding to the lower bits of the j-th column are located closer to the lower control circuit 30 in the figure, and the capacitance elements C5 to C9 are located closer to the display region 100 above, and the capacitance element Cser is located between the capacitance elements C0 to C4 and the capacitance elements C5 to C9.

Also, in the circuits Rb, Bb, Gb, the selection circuit 520 is located at the lowest, i.e., closer to the control circuit 30.

Note that the voltage selection circuits 510 to 519 and the switch Rsw in the DA conversion circuit 500 are omitted in FIG. 13 for simplicity.

As illustrated in FIG. 14, in the circuits Rb, Bb, Gb, the bits D0 to D9 of the video data Vdata selected by the selection circuit 520 are supplied to the circuits D0_L1L2 to D9_L1L2 in order toward the direction opposite to the Y direction.

The other end of the capacitance element C0 to C4 is coupled to one end of the capacitance element Cser via the relay line 14b provided along the Y direction, and the other end of the capacitance element Cser is coupled to the data line 14 provided along the Y direction along with the other end of the capacitance element C5 to C9.

Next, in the present exemplary embodiment, the superiority of each element of the circuits Rb, Bb, Gb is the arrangement illustrated in FIG. 14 will be described.

Figure 15:
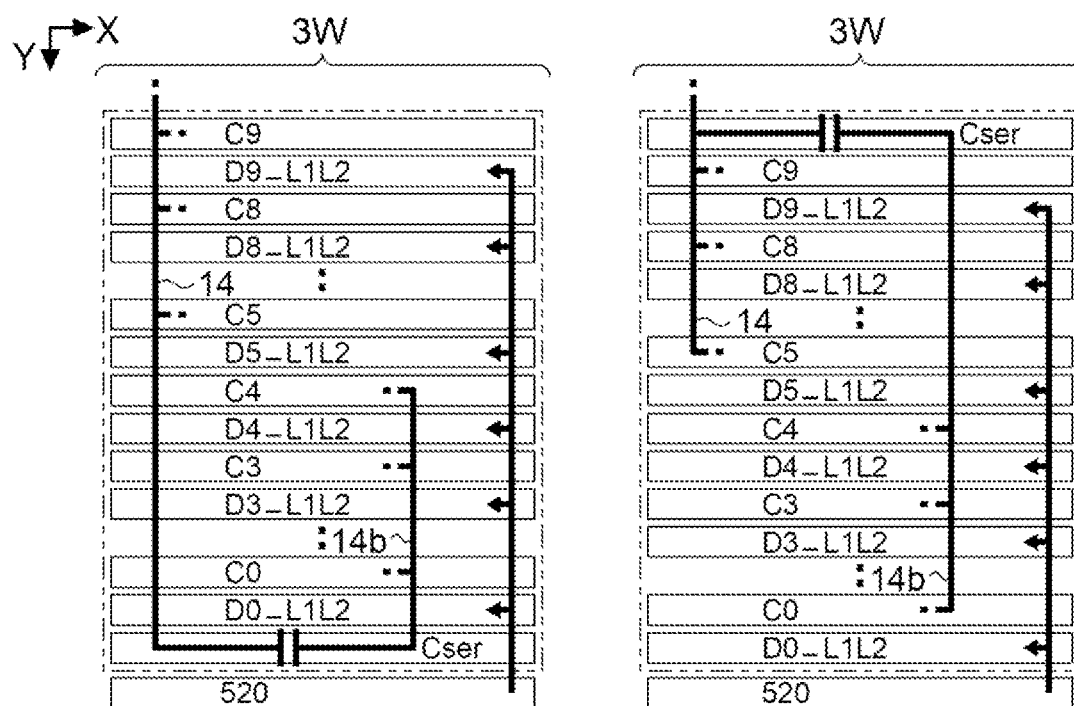
FIG. 15 is a diagram illustrating superiority of the above arrangement.

As the capacitance element Cser, for example, a configuration provided near the selection circuit 520 as illustrated in the left column of FIG. 15 or a configuration provided near the display area 100 as illustrated in the right column of the same figure can be considered.

However, in the configuration illustrated in the left column of FIG. 15, since the data line 14 penetrates substantially through the circuits Rb, Bb, or Gb, the data line 14 is lengthened outside the display region 100.

On the other hand, in the configuration illustrated in the right column of the figure, since the relay line 14b penetrates substantially through the circuits Rb, Bb or Gb, the relay wire 14b is longer than the relay line 14b in the present exemplary embodiment illustrated in FIG. 14 and the relay line 14b illustrated in the left column of FIG. 15.

In other words, in the configuration illustrated in the left column and the right column of FIG. 15, there are portions where the data lines 14 and the relay lines 14b belonging to the same column are arranged side by side along the Y direction, but in the present exemplary embodiment illustrated in FIG. 14, there are no portions where the data lines 14 belonging to the same column and the relay lines 14b are arranged side by side.

Thus, in the present exemplary embodiment, compared to the configuration illustrated in the left column and the right column of FIG. 15, the data line 14 outside the display region 100 can be shortened, and the relay line 14b can be shortened. When the wiring line is long, the capacitance is likely to occur, and thus a decrease in conversion accuracy to the analog is likely to occur. In the present exemplary embodiment, the data line 14 and the relay line 14b can be shortened, and thus the reduction in conversion accuracy to the analog can be suppressed.

Figure 16:
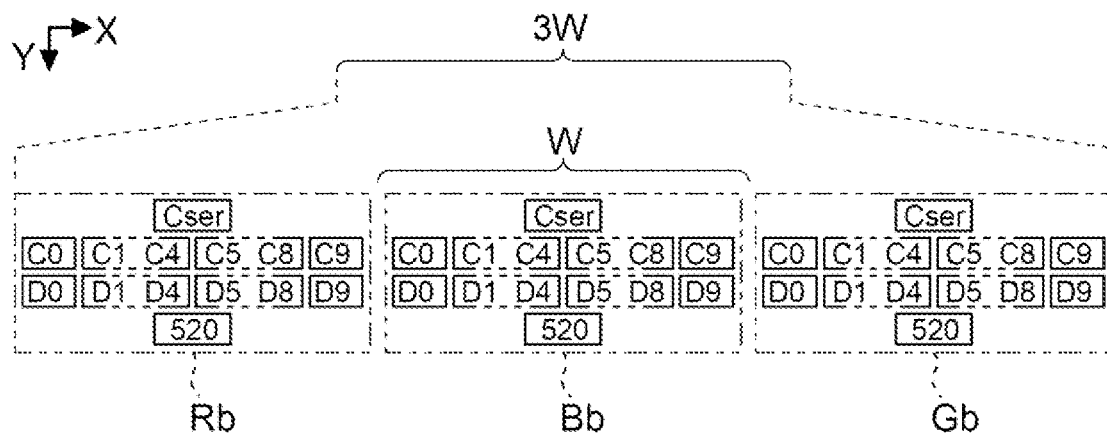
FIG. 16 is a diagram illustrating superiority of the above arrangement.

Also, with respect to the capacitance elements C0 to C9 and the circuit D0_L1L2 to the circuit D9_L1L2, a configuration is conceivable in which they are arranged along the X direction instead of the Y direction, for example, a configuration as illustrated in FIG. 16. Specifically, as illustrated in the figure, a configuration is conceivable in which the circuits Rb, Bb, Gb are arranged along the X direction, the capacitance element Cser is located closer to the display region 100, and the selection circuit 520 is located closer to the control circuit 30.

However, in the configuration illustrated in FIG. 16, when narrowing of the width W is forced due to miniaturization and high resolution demands, of the circuits Rb, Bb or Gb, it becomes difficult to fit all of the capacitance elements C0 to C9 or the circuits D0_L1L2 to the circuit D9_L1L2 in a range narrower than the width W which is the arrangement interval of the data lines 14.

Note that in FIG. 16, the circuit D0_L1L2 to the circuit D9_L1L2 are simply denoted as D0 to D9 due to space limitations.

In contrast, in the present exemplary embodiment, the length along the X direction in the capacitance elements C0 to C9 and the circuit D0_L1L2 to the circuit D9_L1L2 may fall within a range narrower than the width 3W, and thus, it can easily cope with the demand for narrowing the width W as compared to the arrangement illustrated in FIG. 16.

The configuration illustrated in FIG. 13, that is, the configuration in which the circuits Rb, Bb, Gb are arranged in the Y direction in a range narrower than the width 3W will be described in more detail.

Although omitted in FIG. 13, in the capacitance elements C5 to C9 of the circuit Rb closest to the display region 100, not only the data line R14 corresponding to its own circuit Rb, but also the data line B14 corresponding to the circuit Bb and the data line G14 of G corresponding to the circuit Gb pass through lower in the figure, so that the wiring line becomes dense. Here, one of the basic capacitance elements in the capacitance element C5 is described with respect to the configuration of the capacitance elements C5 to C9 in the circuit Rb.

Figure 20:
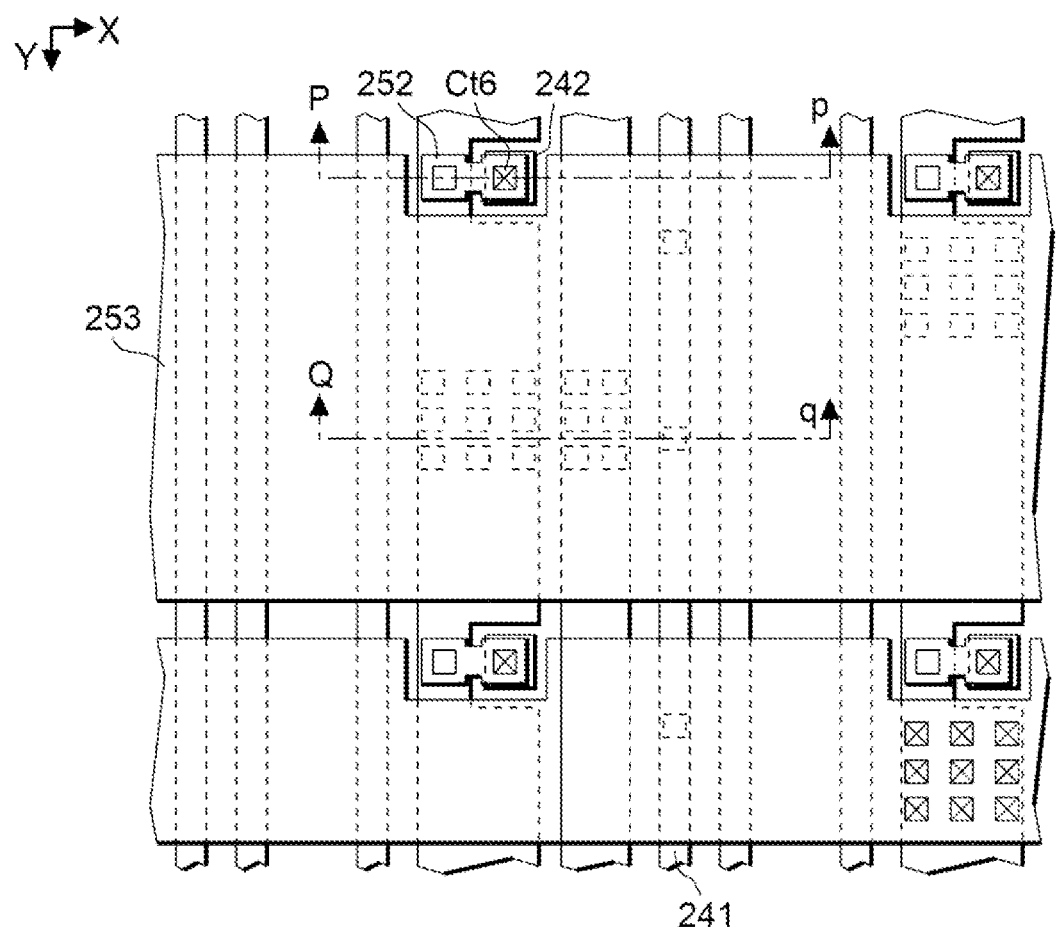
FIG. 20 is a plan view illustrating an example of the capacitance element in the DA conversion circuit.
Figure 21:
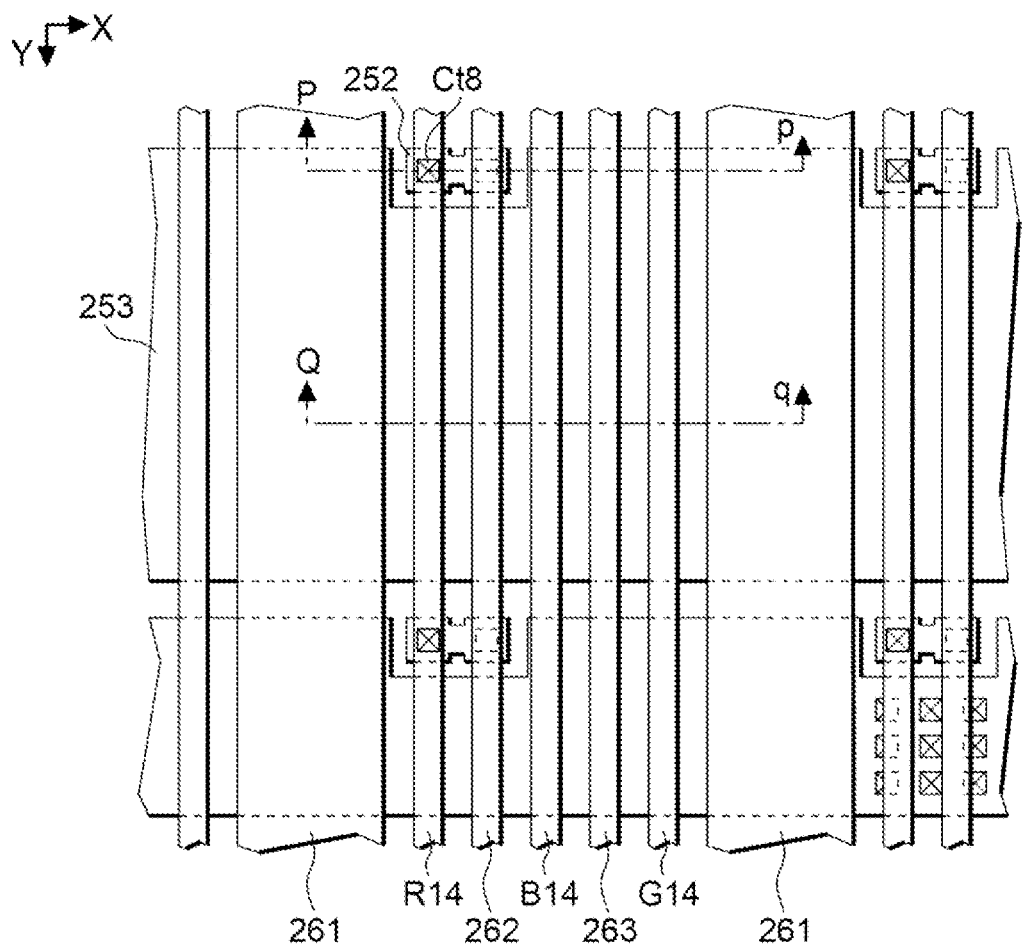
FIG. 21 is a plan view illustrating an example of the capacitance element in the DA conversion circuit.
Figure 22:
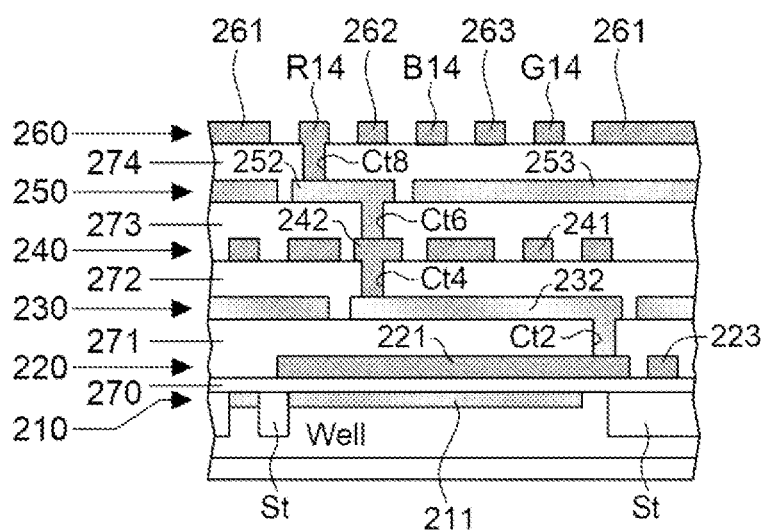
FIG. 22 is a partial cross-sectional view taken along line P-p in FIGS. 17 to 21.

FIGS. 17 to 21 are plan views illustrating one of the basic capacitance elements coupled in parallel in the capacitance element C5; FIG. 22 is a partial cross-sectional view of the basic capacitance element in FIGS. 17 to 21 taken along line P-p; and FIG. 23 is a partial cross-sectional view of the basic capacitance element in FIGS. 17 to 21 taken along line Q-q.

The electro-optical device 10 in the present exemplary embodiment is formed at a semiconductor substrate as described above, but the layer used as the conductive layer or wiring layer in the semiconductor substrate is a total of six layers of a semiconductor layer 210, a gate electrode layer 220, a first wiring layer 230, a second wiring layer 240, a third wiring layer 250, and a fourth wiring layer 260 in the order from the substrate. Therefore, attempting to represent a plan view of the capacitance element C5 and its surroundings with a single diagram complicates the process, so that in FIGS. 17 to 21, the above 6 layers are illustrated in a plan view by two adjacent layers.

Figure 17:
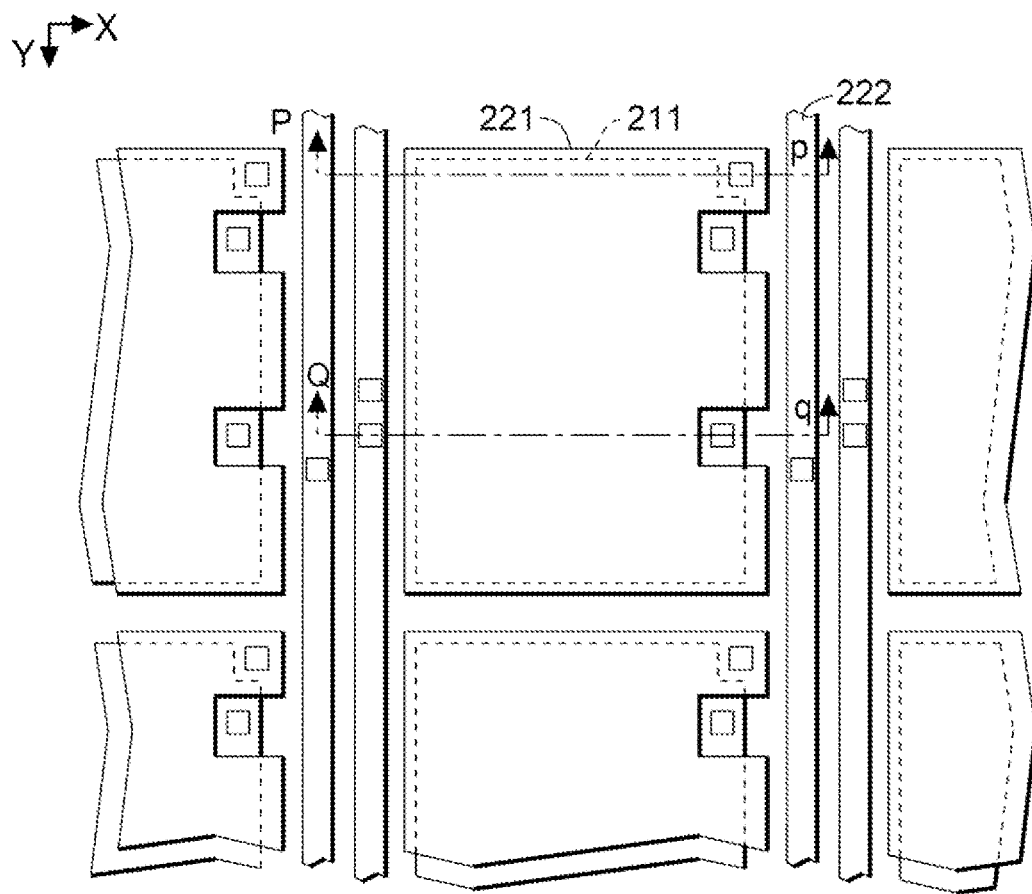
FIG. 17 is a plan view illustrating an example of a capacitance element in the DA conversion circuit.
Figure 18:
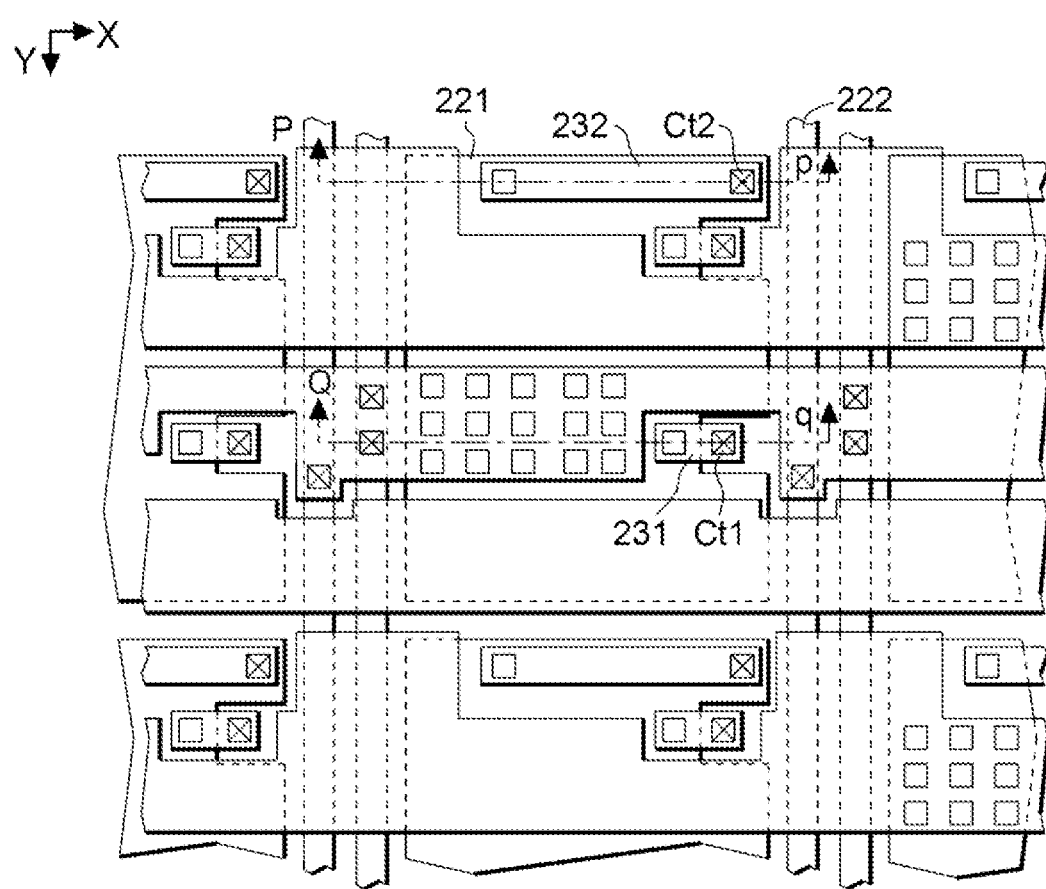
FIG. 18 is a plan view illustrating an example of the capacitance element in the DA conversion circuit.
Figure 19:
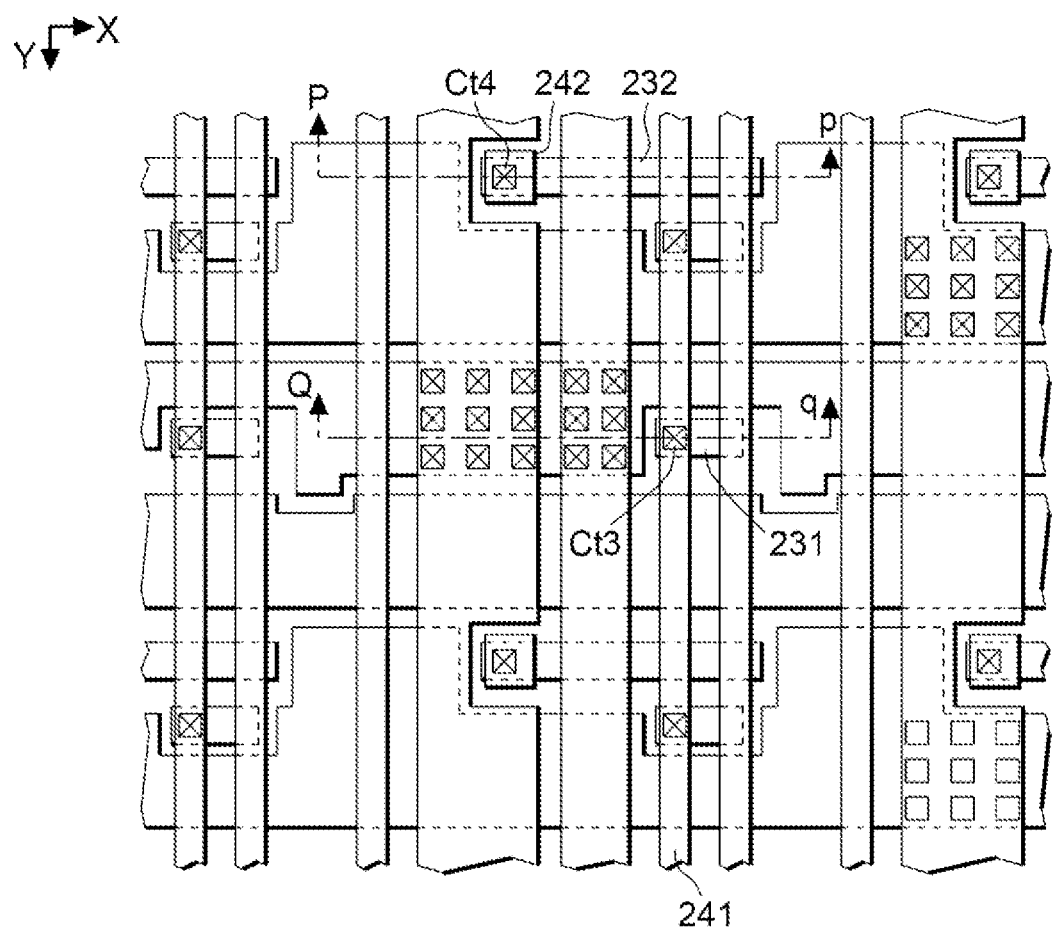
FIG. 19 is a plan view illustrating an example of the capacitance element in the DA conversion circuit.

Specifically, FIG. 17 illustrates a wiring pattern including the semiconductor layer 210 and the gate electrode layer 220. FIG. 18 illustrates a wiring pattern including the gate electrode layer 220 and the first wiring layer 230. FIG. 19 illustrates a wiring pattern including the first wiring layer 230 and the second wiring layer 240. FIG. 20 illustrates a wiring pattern including the second wiring layer 240 and the third wiring layer 250. FIG. 21 illustrates a wiring pattern including the third wiring layer 250 and the fourth wiring layer 260.

Figure 23:
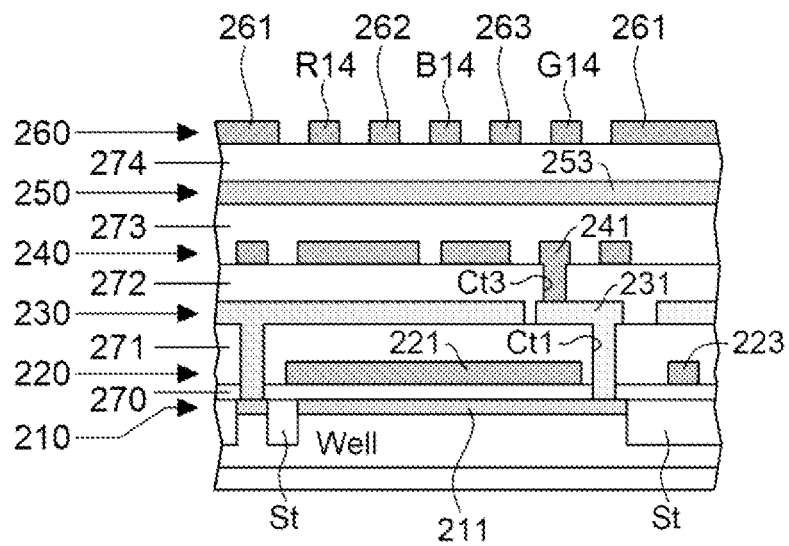
FIG. 23 is a partial cross-sectional view taken along line Q-q in FIGS. 17 to 21.

As illustrated in FIGS. 17, 22 and 23, the basic capacitance element has a configuration in which a gate insulating layer 270 is sandwiched between an electrode 211 made of the semiconductor layer 210 and an electrode 221 at which the gate electrode layer 220 is patterned.

Note that the electrode 211 is formed by injection of impurity ions in a p-well region Well, for example. Also, a region St is a trench for separating regions of adjacent elements.

As illustrated in FIGS. 17, 18, and 23, the electrode 211 is coupled to a wiring line 231 via a contact hole Ct1 that opens the gate insulating layer 270 and a first interlayer insulating layer 271. As illustrated in FIGS. 17, 18, and 22, the electrode 221 is coupled to a wiring line 232 via a contact hole Ct2 that opens the first interlayer insulating layer 271. The first interlayer insulating layer 271 is an insulating layer provided between the gate electrode layer 220 and the first wiring layer 230. The wiring line 231 and the wiring line 232 are wiring lines for relay formed by patterning the first wiring layer 230.

As illustrated in FIGS. 18, 19, and 23, the wiring line 231 is coupled to a wiring line 241 via a contact hole Ct3 that opens a second interlayer insulating layer 272. As illustrated in FIGS. 18, 19, and 22, the wiring line 232 is coupled to a wiring line 242 via a contact hole C4 that opens the second interlayer insulating layer 272. The second interlayer insulating layer 272 is an insulating layer provided between the first wiring layer 230 and the second wiring layer 240.

The wiring line 241 is formed by patterning the second wiring layer 240, and is coupled to the voltage selection circuit 515. In other words, the electrode 211, which is one end of the basic capacitance element, is coupled to the voltage selection circuit 515 via the wiring lines 231, 241. The wiring line 242 is a wiring line for the relay formed by patterning the second wiring layer 240.

As illustrated in FIGS. 19, 20, and 22, the wiring line 242 is coupled to a wiring line 252 via a contact hole Ct6 that opens a third interlayer insulating layer 273. The third interlayer insulating layer 273 is an insulating layer provided between the second wiring layer 240 and the third wiring layer 250. The wiring line 252 is a wiring line for a relay formed by patterning the third wiring layer 250.

In addition to the wiring line 252, a wiring line 253 is formed by patterning the third wiring layer 250. The wiring line 253 is supplied with the voltage used as a power source.

As illustrated in FIGS. 20, 21, and 22, the wiring line 252 is coupled to data line R14 via a contact hole C8 that opens a fourth interlayer insulating layer 274. The fourth interlayer insulating layer 274 is an insulating layer provided between the third wiring layer 250 and the fourth wiring layer 260. The data line R14 is formed by patterning the fourth wiring layer 260.

In addition to the data line R14, the data lines B14, G14, wiring lines 261, 262, and 263 are formed by patterning the fourth wiring layer 260.

The data line B14 is coupled to the other end of the capacitance elements C5 to C9 and the other end of the capacitance element Cser in the lower circuit Bb in FIGS. 17 to 21. The data line G14 is coupled to the other end of the capacitance elements C5 to C9 in the circuit Gb further below the circuit Bb and to the other end of the capacitance element Cser.

The wiring lines 261, 262, and 263 are also powered by a power supply voltage, i.e., a voltage substantially constant in time.

Thus, the data line R14 is shielded by the wiring lines 261, 262 adjacent to the left and right in the figure. That is, when viewed from the data line R14, the wiring lines 261, 262 are examples of shielded wires. Similarly, the data line B14 is shielded by adjacent wiring lines 262, 263 at left and right, and the data line G14 is shielded by adjacent wiring lines 263, 261 at left and right. In other words, when viewed from the data line B14, the wiring lines 262, 263 are examples of shielded wires, and when viewed from the data line G14, the wiring lines 263, 261 are examples of shielded wires.

Although the basic capacitance element coupled in parallel in the capacitance element C5 of the circuit Rb has been described here, the basic capacitance element constituting the capacitance elements C6 to C9 also have the same configuration as those illustrated in FIGS. 17 to 23. Note that the number of basic capacitance elements coupled in parallel to the capacitance elements C6 to C9 is different from that of the capacitance element C5.

Further, also for the capacitance elements C0 to C4 of the circuit Rb, the basic configuration is the same as that illustrated in FIGS. 17 to 23, except that the coupling destination at the other end is replaced with the relay line 14b for R.

The capacitance elements C0 to C9 are similarly provided for the circuits Bb, Gb, but there is no data line R14 in the region where the circuit Bb is provided, and thus there is no need to account for wiring for shielding the data line R14. Also, there is no data line R14 and B14 in the region where the circuit Gb is provided, and thus the there is no need to account for wiring for shielding the data lines R14 and B14.

In the present exemplary embodiment, in the outside of the display region 100, the data lines R14, B14, G14 are shielded not only by the adjacent wiring lines 261, 262, 263 but also by the lower layer wiring line 253, and thus the potential variation of the data lines R14, B14, G14 due to the propagation of noise is suppressed. Thus, in the present exemplary embodiment, the potential variation of the data lines R14, B14, and G14 is suppressed, and high quality display can be achieved.

Second Exemplary Embodiment

Next, the electro-optical device 10 according to a second exemplary embodiment will be described. In each of the following exemplary embodiments, the same reference signs are given to the same configurations as those of the described exemplary embodiments, and detailed description thereof will be omitted.

Figure 24:
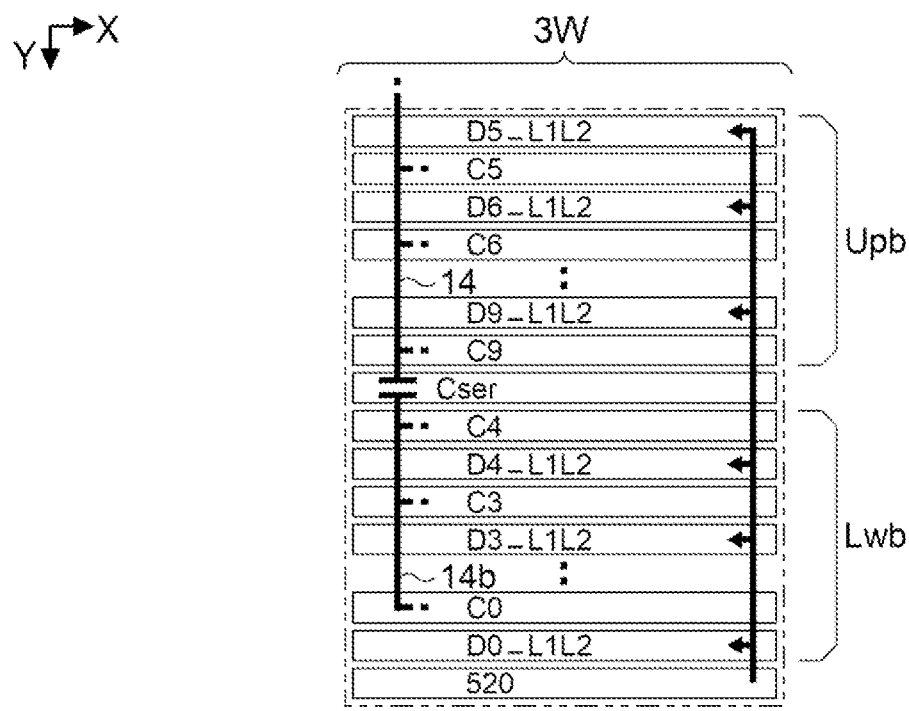
FIG. 24 is a diagram illustrating an arrangement of elements for one color in the data signal output circuit of the electro-optical device according to a second exemplary embodiment.

FIG. 24 is a diagram illustrating, in the electro-optical device 10 according to the second exemplary embodiment, any of the circuits Rb, Bb, Gb corresponding to the j-th column extracted, focusing on the data line 14 of the j-th column of the data signal output circuit 50.

In the second exemplary embodiment illustrated in FIG. 24, the difference from the first exemplary embodiment illustrated in FIG. 14 is the arrangement of the capacitance elements C5 to C9, the circuit D5_L1L2 to the circuit D9_L1L2 corresponding to the upper bit. Specifically, in the second exemplary embodiment, the arrangement of the capacitance elements C9 to C5, the circuit D9_L1L2 to the circuit D5_L1L2 are in symmetric relationship with the arrangement of the capacitance elements C4 to C0, the circuit D4_L1L2 to the circuit D0_L1L2 when viewed as reference to the capacitance element Cser.

The capacitance elements C4 and C9 are substantially the same in capacitance size, and the capacitance size is the largest compared to other capacitance elements C0 to C3, C5 to C8.

Thus, according to the arrangement illustrated in FIG. 24, capacitance elements C5 and C9 having the relatively large capacitance sizes are in close proximity to each other. Although the capacitance element in the electro-optical device 10 is formed using a semiconductor process, in the second exemplary embodiment, the capacitance elements having a relatively large capacitance size are in close proximity to each other, and thus variation in the capacitance size is suppressed. Thus, in the second exemplary embodiment, the conversion accuracy to the analog increases, and thus the linearity of the gradation level is improved, and thus high-quality display is possible.

Note that in the second exemplary embodiment, for the capacitance elements other than the capacitance elements Cser, C4, C9, the distance from the capacitance element Cser gradually increases as the capacitance size decreases. A capacitance element that is not disposed in proximity is likely to cause a variation in the capacitance size than a capacitance element disposed in close proximity, but the effect is small because the capacitance size is small.

Third Exemplary Embodiment

Figure 25:
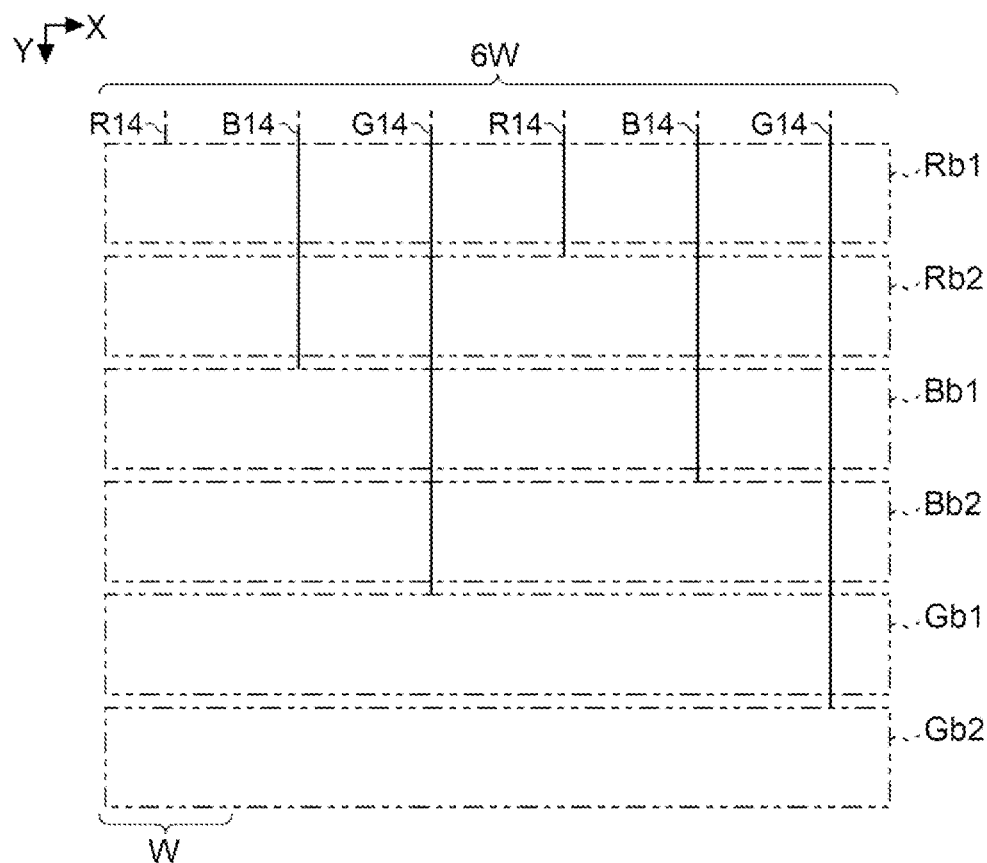
FIG. 25 is a diagram illustrating an arrangement of elements for six columns in the data signal output circuit of the electro-optical device according to a third exemplary embodiment.

FIG. 25 is a diagram illustrating an arrangement of circuits corresponding to six columns of the data signal output circuits 50 in the electro-optical device 10 according to a third exemplary embodiment. Note that the six columns are for two columns of color pixels, and specifically, are columns corresponding to R, B, G, R, B, and G. In the figure, the width 6W is twice as long as the width 3W. For convenience, in the six columns, the circuits corresponding to the columns of the data lines R14, B14, G14 located at the left in the figure are denoted as Rb1, Bb1, Gb1 in the order, and the circuits corresponding to the columns of the data lines R14, B14, G14 located at the right are denoted as Rb2, Bb2, Gb2 in order.

As illustrated in FIG. 25, in the third exemplary embodiment, circuits Rb1, Rb2, Bb1, Bb2, Gb1, Gb2 are arranged in a single column along the Y direction in a range that is wider than the width W, and is narrower than the width 6W.

Thus, in the third exemplary embodiment, the circuits Rb1, Rb2, Bb1, Bb2, Gb1, Gb2 may fall within a range narrower than the width 6W, and thus can more easily cope with the narrowing of the width W as compared with the first exemplary embodiment illustrated in FIG. 14 and the second exemplary embodiment illustrated in FIG. 24.

Fourth Exemplary Embodiment

Figure 26:
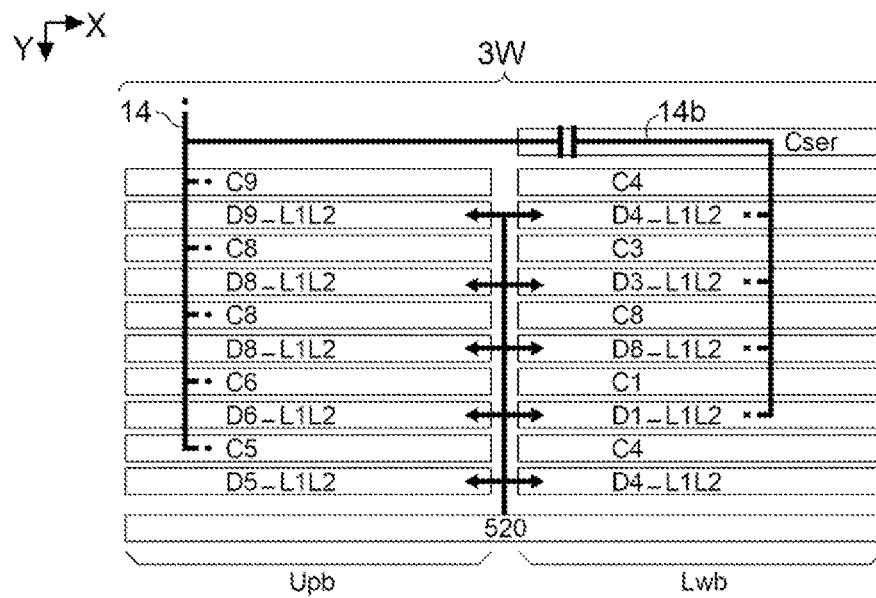
FIG. 26 is a diagram illustrating an arrangement of elements for one color in the data signal output circuit of the electro-optical device according to a fourth exemplary embodiment.

FIG. 26 is a diagram illustrating, in the electro-optical device 10 according to a fourth exemplary embodiment, any of the circuits Rb, Bb, Gb corresponding to the j-th column extracted, focusing on the data line 14 of the j-th column of the data signal output circuit 50.

In the fourth exemplary embodiment, the difference between the first exemplary embodiment illustrated in FIG. 14 is a feature where the first DA conversion circuit Upb corresponding to the upper bit and the second DA conversion circuit Lwb corresponding to the lower bit are arranged in two columns.

Specifically, in the first DA conversion circuit Upb, in the order toward the Y direction, the capacitance element C9, the circuit D9_L1L2, the capacitance element C8, the circuit D8_L1L2, the capacitance element C7, the circuit D7_L1L2, the capacitance element C6, the circuit D6_L1L2, the capacitance element C5, and the circuit D5_L1L2 are arranged in a single column. Additionally, in the second DA conversion circuit Lwb, in the order toward the Y direction, the capacitance element C4, the circuit D4_L1L2, the capacitance element C3, the circuit D3_L1L2, the capacitance element C2, the circuit D2_L1L2, the capacitance element C1, the circuit D1_L1L2, the capacitance element C1, and the circuit D1_L1L2 are arranged adjacent to the columns of the first DA conversion circuit Upb.

Note that in the third exemplary embodiment, the selection circuit 520 is located at the lowest, i.e., closer to the control circuit 30, in the figure, and the capacitance element Cser is located at the top of the figure, i.e., closer to the display region 100.

Figure 27:
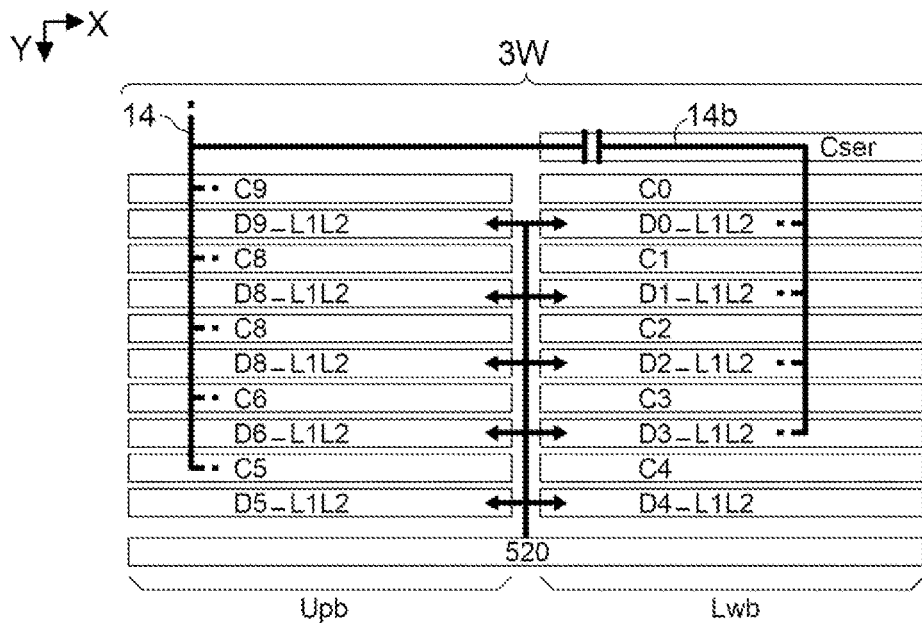
FIG. 27 is a diagram illustrating a comparative example for comparing the arrangement in the fourth exemplary embodiment.

FIG. 27 is a diagram illustrating a comparative example of a fourth exemplary embodiment. In this comparative example, the arrangement order of the elements in the second DA conversion circuit Lwb is in the reverse relationship to the fourth exemplary embodiment in FIG. 26. Specifically, in the second DA conversion circuit Lwb in the comparative example, in the order toward the Y direction, the capacitance element C4, the circuit D4_L1L2, the capacitance element C3, the circuit D3_L1L2, the capacitance element C2, the circuit D2_L1L2, the capacitance element C1, the circuit D1_L1L2, the capacitance element C0, and the circuit D0_L1L2 are arranged in a single column.

In the fourth exemplary embodiment illustrated in FIG. 26 and the comparative example illustrated in FIG. 27, at first glance, there seems to be no difference, but there is a difference when the basic capacitance elements are coupled in parallel by the number of capacitance elements C0 to C9 according to the weight.

The capacitance sizes of the capacitance elements C0 to C4 (C5 to C9) is 1:2:4:8:16. Therefore, in the fourth exemplary embodiment, regarding the capacitance elements C0 to C4 (C5 to C9), the number and arrangement of parallel couplings of the basic capacitance elements corresponding to the capacitance size "1" will be examined.

Figure 28:
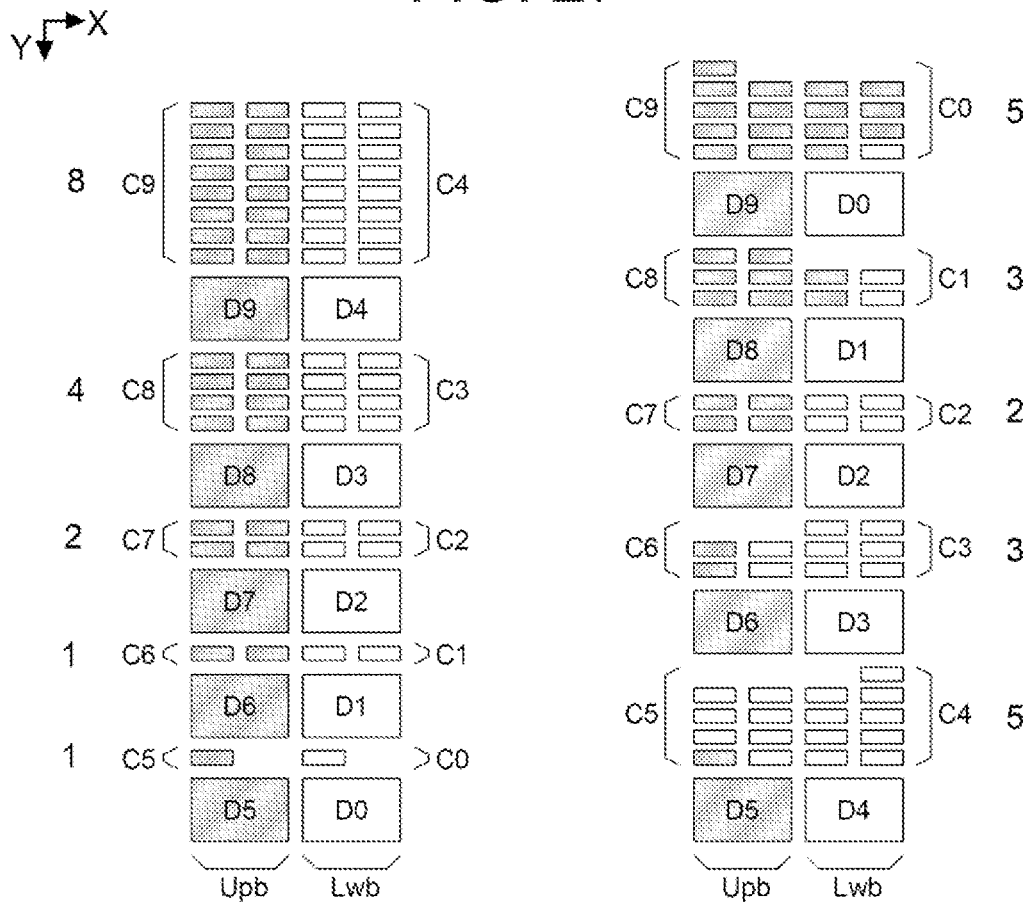
FIG. 28 is a diagram illustrating superiority of the arrangement in the fourth exemplary embodiment.

FIG. 28 is a diagram for illustrating superiority of the fourth exemplary embodiment relative to the comparative example.

In the figure, the left column indicates an arrangement of elements in the fourth exemplary embodiment, and the right column indicates an arrangement of elements in the comparative example. In addition, the hatched portion is an element related to the first DA conversion circuit Upb, and the unhatched portion is an element related to the second DA conversion circuit Lwb. The sizes of the circuits D0_L1L2 to D9_L1L2 are the same in the first DA conversion circuit Upb and the second DA conversion circuit Lwb.

In FIG. 28, the circuit D0_L1L2 to the circuit D9_L1L2 are simply denoted as D0 to D9 due to space limitations.

As illustrated in FIG. 28, in a case where the basic capacitance element coupled in parallel is arranged in two columns in the capacitance elements C0 to C9, in the fourth exemplary embodiment, the number of rows required for the capacitance elements C5 to C9 (C0 to C4) is "1", "1", "2", "4", and "8" in that order, for a total of 16 rows. On the other hand, in the comparative example, the number of rows required for the capacitance elements C5 to C9 (C4 to C0) is "5", "3", "2", "3", and "5" in order, which is a total of 18 rows.

Therefore, in the fourth exemplary embodiment, the length in the Y direction can be reduced by two rows of the basic capacitance element as compared with the comparative example, and the space can be saved by that amount.

Application Example, Modification Example

In the various exemplary embodiments described above (hereinafter referred to as "exemplary embodiments, etc."), the OLED 130 has been described as an example of the display element, but other display elements may be used. For example, an LED may be used as the display element.

In addition, in the exemplary embodiments, etc., a 10 bit conversion example is illustrated as the DA conversion circuit 500, but the number of bits is not limited.

In the exemplary embodiment, etc., it is divided into the lower bits D0 to D4 and the upper bits D5 to D9, but it may be divided into three or more. For example, it may be divided into the lower bits D0 to D2, the middle bits D3 to D6, and the upper bits D7 to D9. In the case of being divided in this way, the DA conversion circuit 500 is in the configuration illustrated in FIG. 29.

Specifically, the DA conversion circuit 500 has a configuration in which the other end of the capacitance elements C0 to C2 is brought to one end of the capacitance element Cser1, the other end of the capacitance element Cser1 is coupled to the other end of the capacitance elements C3 to C6 and one end of the capacitance element Cser2, and the other end of the capacitance element Cser2 is coupled to the other end of the capacitance elements C7 to C9 and the data line 14. In addition, in this configuration, when the coupling line of the other end of the capacitance elements C0 to C2 and the capacitance element Cser1 is the relay line 14*b*, and the coupling line of the other end of the capacitance element Cser1 and the other end of the capacitance elements C3 to C6 is the relay line 14*c*, the relay lines 14*b* and 14*c* may be applied with the potential Vrst by the switches Rsw1 and Rsw2. in the initialization period (a).

In this configuration, the voltage corresponding to the weight of the upper bits D7 to D9 is output to the data line 14 by the capacitance elements C7 to C9 and the voltage selection circuits 517 to 519. Thus, the circuit including the capacitance elements C7 to C9 and the voltage selection circuits 517 to 519 becomes the upper first DA conversion circuit Upb.

The voltage corresponding to the weight of the middle bits D3 to D6 is output to the data line 14 by the capacitance elements C3 to C6 and Cser2 and the voltage selection circuits 513 to 516. Thus, the configuration including the capacitance elements C3 to C6 and the voltage selection circuits 513 to 516 and excluding the capacitance element Cser2 is the medium DA conversion circuit Mdb.

Additionally, a voltage corresponding to the weight of the lower bits D0 to D2 is output to the data line 14 by the capacitance elements C0 to C2, Cser1, Cser2, and the voltage selection circuits 510 to 512. Therefore, the configuration including the capacitance elements C0 to C2 and the voltage selection circuits 510 to 512 and excluding the capacitance elements Cser1 and Cser2 is the lower second DA conversion circuit Lwb.

Figure 29:
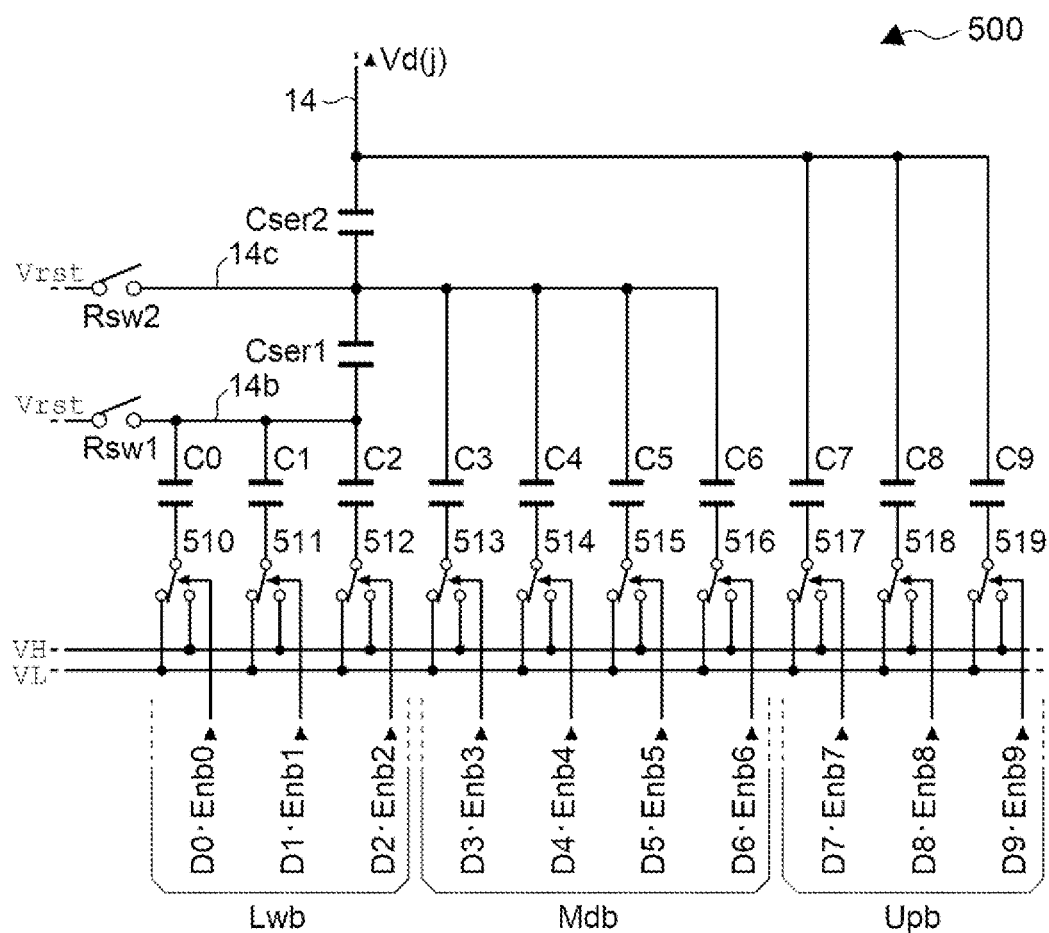
FIG. 29 is a diagram illustrating an equivalent circuit of a DA conversion circuit according to a modification example of the present disclosure.

Note that in the configuration illustrated in FIG. 29, among the 10 bits of video data Vdata, the bits D7 to D9 are an example of the upper two or more bits, and the bits D0 to D2 are an example of a part of the bits excluding the upper two or more bits.

In this configuration, the capacitance elements C7 to C9 are an example of the upper capacitance element portion, for example, the capacitance element C7 is an example of the first capacitance element, and the capacitance element C8 is an example of the second capacitance element. Additionally, in this configuration, the capacitance elements C0 to C2 are an example of the lower capacitance element portion, for example, the capacitance element C0 is an example of the third capacitance element, and the capacitance element C1 is an example of the fourth capacitance element.

In the exemplary embodiments, etc., the configuration is such that the threshold voltage of the transistor 121 in the pixel circuit 110 is compensated, but the configuration may not compensate for the threshold voltage, and specifically, the configuration may be such that the transistor 123 is omitted.

The channel type of the transistors 66, 121 to 125 is not limited to exemplary embodiments, etc. These transistors 66, 121 to 125 may also be replaced with a transmission gate as appropriate. Conversely, the transmission gates Tg0 to Tg2 may be replaced with one channel type transistor.

Electronic Apparatus

Next, an electronic apparatus to which the electro-optical device 10 according to the above-described exemplary embodiments is applied will be described. The electro-optical device 10 is suitable for application with a small pixel and high definition display. In this regards, a head-mounted display will be described as an example of the electronic apparatus.

Figure 30:
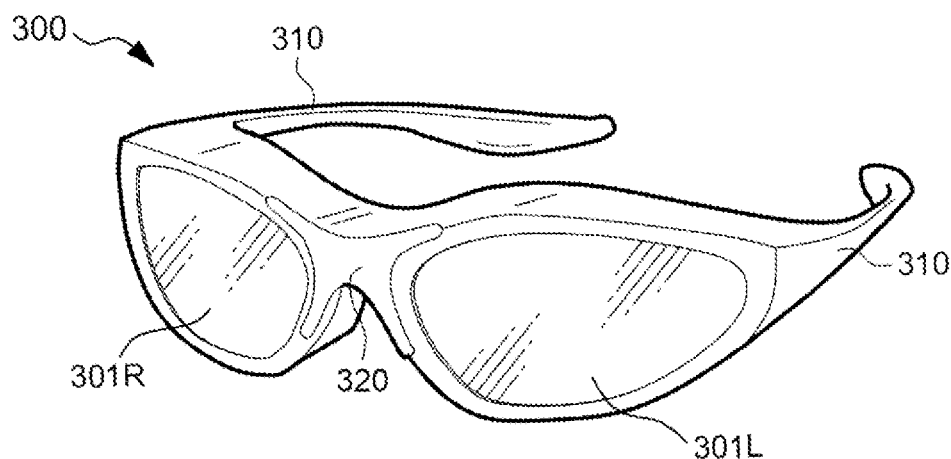
FIG. 30 is a perspective view illustrating a head-mounted display using the electro-optical device.
Figure 31:
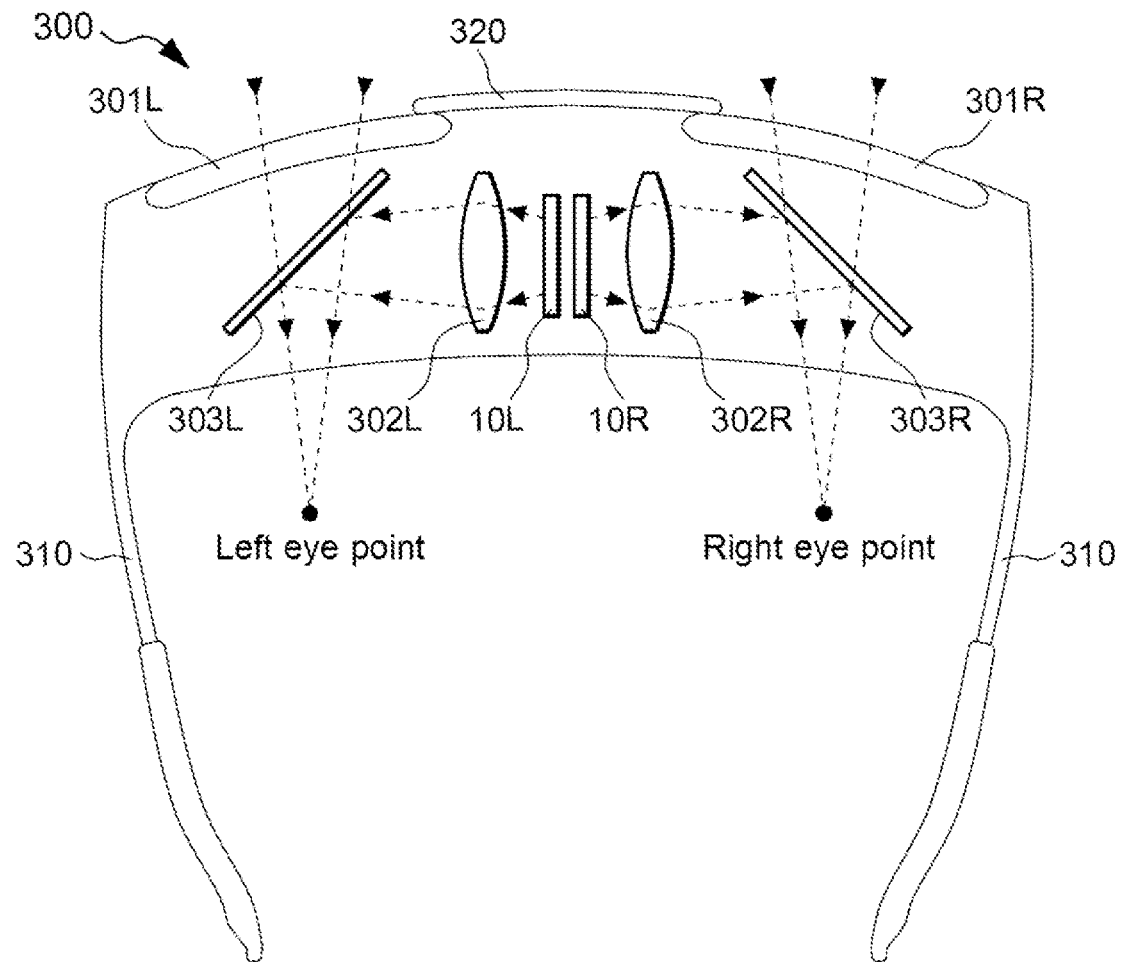
FIG. 31 is a diagram illustrating an optical configuration of the head-mounted display.

FIG. 30 is a view illustrating appearance of the head-mounted display, and FIG. 31 is a view illustrating an optical configuration of the head-mounted display.

First, as illustrated in FIG. 30, a head-mounted display 300 includes, in terms of appearance, temples 310, a bridge 320, and lenses 301L and 301R, as with typical eye glasses. In addition, as illustrated in FIG. 31, the head-mounted display 300 is provided with an electro-optical device 10L for a left eye and an electro-optical device 10R for a right eye in the vicinity of the bridge 320 and on the back side (the lower side in the figure) of the lenses 301L and 301R.

An image display surface of the electro-optical device 10L is disposed to be on the left side in FIG. 31. According to this configuration, a display image by the electro-optical device 10L is output via an optical lens 302L in a 9-o'clock direction in the figure. A half mirror 303L reflects the display image by the electro-optical device 10L in a 6-o'clock direction, while the half mirror 303L transmits light entering in a 12-o'clock direction. The image display surface of the electro-optical device 10R is disposed so as to be on the right opposite to the electro-optical device 10L. According to this configuration, a display image by the electro-optical device 10R is output via an optical lens 302R in a 3-o'clock direction in the figure. A half mirror 303R reflects the display image by the electro-optical device 10R in a 6-o'clock direction, while the half the mirror 303R transmits light entering in a 12-o'clock direction.

In this configuration, a wearer of the head-mounted display 300 can observe the display images by the electro-optical devices 10L and 10R in a see-through state in which the display images by the electro-optical devices 10L and 10R overlap with the outside.

Further, in the head-mounted display 300, when the electro-optical device 10L displays the image for the left eye and the electro-optical device 10R displays the image for the right eye among the binocular images accompanied by parallax, it is possible to make the wearer perceive the displayed image as if it has a depth and a three-dimensional effect.

Note that, the electronic apparatus including the electro-optical device 10 can be applied not only to the head-mounted display 300 but also to an electronic viewing finder in a video camera, a lens-exchangeable digital camera, etc.

Addendum

An electro-optical device according to one aspect (aspect 1) includes a display element provided corresponding to an intersection of a data line and a scanning line, and a DA conversion circuit, wherein the DA conversion circuit includes a first DA conversion circuit configured to convert upper two or more bits among a plurality of bits into a first gradation voltage corresponding to the upper two or more bits, and apply the first gradation voltage to the data line, a second DA conversion circuit configured to convert a part or all of the bits excluding the upper two or more bits among the plurality of bits into a second gradation voltage that reflects the part or all of the bits excluding the upper two or more bits, and a coupling capacitance including one end electrically coupled to the second DA conversion circuit and another end electrically coupled to the data line, the first DA conversion circuit includes an upper capacitance element portion including a first capacitance element and a second capacitance element corresponding to each of the upper two or more bits, the first capacitance element and the second capacitance element are arranged in a direction along the data line, the second DA conversion circuit includes a lower capacitance element portion including a third capacitance element and a fourth capacitance element corresponding to each of the part or all of the bits excluding the upper two or more bits, and the third capacitance element and the fourth capacitance element are arranged in a direction along the data line.

According to the aspect 1, the voltage converted by the second DA conversion circuit is compressed by passing through the coupling capacitance, and output to the data line. In the aspect 1, the first capacitance element and the second capacitance element included in the upper capacitance element portion are arranged in the direction along the data line, and the third capacitance element and the fourth capacitance element included in the lower capacitance element portion are also arranged in the direction along the data line, so that for example, as compared with the configuration in which these capacitance elements are arranged in the direction orthogonal to the data line, it becomes possible to cope with the narrowing.

In the electro-optical device according to the specific aspect (aspect 2) of aspect 1, the upper capacitance element portion, the coupling capacitance, and the lower capacitance element portion are arranged in a direction along the data line, and the coupling capacitance is provided between the upper capacitance element portion and the lower capacitance element portion.

According to the aspect 2, the wiring line length of the data line can be shortened compared to a configuration in which the upper capacitance element portion, the lower capacitance element portion, the coupling capacitance are arranged in the order, or the coupling capacitance, the upper capacitance element portion, and the lower capacitance element portion are arranged in the order.

In the electro-optical device according to the specific aspect (aspect 3) of aspect 1 or aspect 2, the coupling capacitance is provided between a relay line to which the second gradation voltage converted by the second DA conversion circuit is applied and the data line.

In the electro-optical device according to the specific aspect (aspect 4) of aspect 3, the relay line is provided in a direction along the data line, and the data line and the relay line are arranged in a non-parallel manner. According to the aspect 4, both wiring line length of the data line and wiring line length of the relay line can be shortened.

In addition, being arranged in a non-parallel manner means that there is no part where the data line and the relay line are arranged side by side, specifically, there is no part where the data line and the relay line overlap when viewed from the orthogonal direction of the data line.

In the electro-optical device according to the specific aspect (aspect 5) of any one of aspects 1 to 4, a width of the first DA conversion circuit, the coupling capacitance, and the second DA conversion circuit in a direction along the scanning line is greater than a first width between the data line and a data line disposed adjacent to the data line in a direction along the scanning line, and is less than six times the first width. According to the aspect 5, even if the arrangement interval of the data lines narrows, it can be easily dealt with.

In the electro-optical device according to the specific aspect (aspect 6) of any one of aspects 1 to 5, a wiring line for supplying a signal to one end of the upper capacitance element portion and the data line configured to output a signal from another end of the upper capacitance element portion are provided indifferent wiring layers.

According to the aspect 6, since the wiring line of the signal supplied to one end of the upper capacitance element portion and the wiring line of the signal output from the other end of the upper capacitance element portion are provided in different wiring layers, the noise caused by the voltage change is less likely to propagate.

In the electro-optical device according to the specific aspect (aspect 7) of aspect 6, the data line is provided between two shield lines having a fixed potential.

According to the aspect 7, since noise is less likely to propagate in the data line, the display quality associated with the voltage variation of the data line can be suppressed.

The electronic apparatus according to the specific aspect (aspect 8) of any one of aspects 1 to 7 includes the electro-optical device according to any one of the above aspects. According to the aspect 8, miniaturization and narrowing of the electro-optical device are facilitated.

What is claimed is:

1. An electro-optical device comprising:
    a display element provided corresponding to an intersection of a data line and a scanning line; and
    a Digital-to-Analog (DA) conversion circuit, wherein the DA conversion circuit includes:
    a first DA conversion circuit configured to convert upper two or more bits among a plurality of bits into a first gradation voltage corresponding to the upper two or more bits, and apply the first gradation voltage to the data line;
    a second DA conversion circuit configured to convert a part or all of the bits excluding the upper two or more bits among the plurality of bits into a second gradation voltage that reflects the part or all of the bits excluding the upper two or more bits; and
    a coupling capacitance including one end electrically coupled to the second DA conversion circuit and another end electrically coupled to the data line,
    the first DA conversion circuit includes an upper capacitance element portion including a first capacitance element and a second capacitance element corresponding to each of the upper two or more bits,
    the first capacitance element and the second capacitance element are arranged in a direction along the data line,
    the second DA conversion circuit includes a lower capacitance element portion including a third capacitance element and a fourth capacitance element corresponding to each of the part or all of the bits excluding the upper two or more bits, and
    the third capacitance element and the fourth capacitance element are arranged in a direction along the data line.

2. The electro-optical device according to claim 1, wherein
the coupling capacitance is provided between a relay line to which the second gradation voltage converted by the second DA conversion circuit is applied and the data line.

3. The electro-optical device according to claim 2, wherein
the relay line is provided in a direction along the data line, and
the data line and the relay line are arranged in a non-parallel manner.

4. The electro-optical device according to claim 1, wherein
a wiring line for supplying a signal to one end of the upper capacitance element portion and
the data line configured to output a signal from another end of the upper capacitance element portion
are provided in different wiring layers.

5. The electro-optical device according to claim 4, wherein
the data line is provided between two shield lines having a fixed potential.

6. The electro-optical device according to claim 1, wherein
the upper capacitance element portion, the coupling capacitance, and the lower capacitance element portion are arranged in a direction along the data line, and
the coupling capacitance is provided between the upper capacitance element portion and the lower capacitance element portion.

7. The electro-optical device according to claim 1, wherein
a width of the first DA conversion circuit, the coupling capacitance, and the second DA conversion circuit in a direction along the scanning line is greater than a first width between the data line and a data line disposed adjacent to the data line in a direction along the scanning line, and is less than six times the first width.

8. An electronic apparatus comprising the electro-optical device according to claim 1.

* * * * *